(12) United States Patent
Vida et al.

(10) Patent No.: US 11,916,514 B2
(45) Date of Patent: Feb. 27, 2024

(54) RADIO-FREQUENCY APPARATUS WITH MULTI-BAND WIDEBAND BALUN AND ASSOCIATED METHODS

(71) Applicant: Silicon Laboratories Inc., Austin, TX (US)

(72) Inventors: Zoltan Vida, Budapest (HU); Attila L Zolomy, Budapest (HU)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/719,925

(22) Filed: Dec. 18, 2019

(65) Prior Publication Data

US 2020/0127605 A1    Apr. 23, 2020

Related U.S. Application Data

(63) Continuation-in-part of application No. 15/845,327, filed on Dec. 18, 2017, and a continuation-in-part of application No. 15/845,369, filed on Dec. 18, 2017, and a continuation-in-part of application No. 15/823,319, filed on Nov. 27, 2017.

(51) Int. Cl.
*H03H 7/38* (2006.01)
*H03H 7/42* (2006.01)
*H03D 7/14* (2006.01)
*H03D 9/06* (2006.01)

(52) U.S. Cl.
CPC .............. *H03D 7/1458* (2013.01); *H03D 9/06* (2013.01); *H03H 7/383* (2013.01); *H03H 7/422* (2013.01); *H03D 2200/0023* (2013.01); *H03H 7/425* (2013.01); *H03H 2007/386* (2013.01)

(58) Field of Classification Search
CPC .............................. H03D 9/06; H03H 7/383
See application file for complete search history.

(56) References Cited

U.S. PATENT DOCUMENTS

| | | |
|---|---|---|
| 4,328,501 A | 5/1982 | DeSantis |
| 4,799,066 A | 1/1989 | Deacon |
| 5,631,611 A | 5/1997 | Luu |
| 5,874,926 A | 2/1999 | Tsuru |

(Continued)

FOREIGN PATENT DOCUMENTS

| | | |
|---|---|---|
| CN | 106505962 A | 3/2017 |
| EP | 2214306 | 8/2010 |
| KR | 20150072119 A | 6/2015 |

OTHER PUBLICATIONS https://www.electronics-tutorials.ws/accircuits/parallel-resonance.html., accessed via archive.org on Jun. 12, 2017 (Year: 2017).*

(Continued)

*Primary Examiner* — Samuel S Outten
(74) *Attorney, Agent, or Firm* — Law Offices of Maximilian R. Peterson

(57) ABSTRACT

An apparatus includes an RF apparatus, and a wideband multi-band matching balun. The wideband multi-band matching balun includes a multi-band balun, which includes at least one three-element frequency-dependent resonator (TEFDR). The wideband multi-band matching balun further includes a differential-to-differential matching circuit coupled to the RF apparatus. The differential-to-differential matching circuit includes at least one TEFDR.

20 Claims, 27 Drawing Sheets

(56) References Cited

U.S. PATENT DOCUMENTS

| | | | |
|---|---|---|---|
| 5,889,445 A | 3/1999 | Ritter | |
| 5,949,299 A | 9/1999 | Harada | |
| 5,995,814 A | 11/1999 | Yeh | |
| 6,009,318 A | 12/1999 | Freed | |
| 6,329,886 B1 | 12/2001 | Ogoro | |
| 6,603,430 B1 | 8/2003 | Hill | |
| 6,862,441 B2 | 3/2005 | Ella | |
| 6,980,776 B2 | 12/2005 | Shimada | |
| 6,990,357 B2 | 1/2006 | Ella | |
| 7,034,630 B2 | 4/2006 | Rijks | |
| 7,058,372 B1 | 6/2006 | Pardoen | |
| 7,088,307 B2 | 8/2006 | Imaizumi | |
| 7,116,185 B2 | 10/2006 | Ohi | |
| 7,155,252 B2 | 12/2006 | Martin | |
| 7,193,477 B2 | 3/2007 | Chang | |
| 7,199,684 B2 | 4/2007 | Aigner | |
| 7,248,844 B2 | 7/2007 | Rofougaran | |
| 7,323,939 B2 | 1/2008 | Han et al. | |
| 7,330,085 B2 | 2/2008 | Ezzeddine | |
| 7,466,277 B2 | 12/2008 | Ishizuka | |
| 7,489,914 B2 | 2/2009 | Govind | |
| 7,518,469 B2 | 4/2009 | Kemmochi | |
| 7,557,757 B2 | 7/2009 | Deavours | |
| 7,586,388 B2 | 9/2009 | Harada | |
| 7,683,733 B2 | 3/2010 | Li | |
| 7,755,435 B2 | 7/2010 | Lu et al. | |
| 7,978,024 B2 | 7/2011 | Cheng | |
| 8,068,795 B2 | 11/2011 | Bavisi | |
| 8,081,047 B2 | 12/2011 | Royak | |
| 8,138,853 B2 | 3/2012 | Chu | |
| 8,164,387 B1 | 4/2012 | Apel | |
| 8,174,390 B2 | 5/2012 | Kim | |
| 8,229,367 B2 | 7/2012 | Chan et al. | |
| 8,306,489 B2 | 11/2012 | Schwarzmueller | |
| 8,344,952 B2 | 1/2013 | Yi | |
| 8,368,481 B2 | 2/2013 | Jin | |
| 8,436,695 B2 | 5/2013 | Mu | |
| 8,493,126 B2 | 7/2013 | Sankaranarayanan | |
| 8,633,781 B2 | 1/2014 | Bradley | |
| 8,842,410 B2 | 9/2014 | Chan | |
| 9,059,681 B2 | 6/2015 | Tanaka | |
| 9,083,301 B2 | 7/2015 | Tanaka | |
| 9,106,204 B2 | 8/2015 | Fritz | |
| 9,306,535 B2 | 4/2016 | Bradley | |
| 9,316,723 B2 | 4/2016 | Tayrani | |
| 9,397,720 B2 | 7/2016 | Jerng | |
| 9,520,854 B2 | 12/2016 | Kim | |
| 9,647,706 B2 | 5/2017 | Salfelner | |
| 9,680,442 B2 | 6/2017 | Salfelner | |
| 9,917,566 B2 | 3/2018 | Salfelner | |
| 9,939,471 B1 | 4/2018 | Omoumi | |
| 9,991,597 B2 | 6/2018 | Velandia | |
| 10,071,605 B1 | 9/2018 | Liang | |
| 10,305,532 B1 | 5/2019 | Jantzi | |
| 10,374,300 B2 | 8/2019 | Rahikkala | |
| 2002/0118075 A1 | 8/2002 | Ohwada | |
| 2003/0012808 A1 | 7/2003 | Ella | |
| 2003/0174093 A1 | 9/2003 | Huber | |
| 2003/0210189 A1 | 11/2003 | Jinushi | |
| 2005/0003771 A1 | 1/2005 | De Ruijter | |
| 2005/0174297 A1 | 8/2005 | Cake | |
| 2005/0208917 A1 | 9/2005 | Roufoogaran | |
| 2006/0044080 A1 | 3/2006 | Hagiwara | |
| 2006/0092079 A1 | 5/2006 | de Rochemont | |
| 2006/0103578 A1 | 5/2006 | Landaeus | |
| 2007/0001704 A1 | 1/2007 | O'Mahony | |
| 2007/0024377 A1 | 2/2007 | Wang | |
| 2007/0268092 A1 | 11/2007 | Inoue | |
| 2008/0129610 A1 | 6/2008 | Tsafati et al. | |
| 2008/0174383 A1 | 7/2008 | Zolomy et al. | |
| 2008/0186106 A1 | 8/2008 | Christian | |
| 2008/0278258 A1 | 11/2008 | Liu | |
| 2009/0015500 A1 | 1/2009 | Hoshiai | |
| 2009/0085689 A1 | 4/2009 | Rohani | |
| 2009/0121959 A1 | 5/2009 | Li | |
| 2009/0130999 A1 | 5/2009 | Chen | |
| 2009/0174618 A1 | 7/2009 | Huang | |
| 2009/0251382 A1 | 10/2009 | Umehara | |
| 2009/0315792 A1 | 12/2009 | Miyashita | |
| 2009/0322617 A1 | 12/2009 | Tseng | |
| 2010/0073248 A1 | 3/2010 | Motta | |
| 2010/0109846 A1 | 5/2010 | Nagai | |
| 2010/0231451 A1 | 9/2010 | Noguchi | |
| 2010/0238079 A1 | 9/2010 | Ayatollahi | |
| 2010/0253581 A1 | 10/2010 | Tsou | |
| 2010/0265145 A1 | 10/2010 | Chung | |
| 2010/0289700 A1 | 11/2010 | Yang | |
| 2011/0223873 A1 | 9/2011 | Qiu | |
| 2011/0256841 A1 | 10/2011 | Kakuya | |
| 2012/0001821 A1 | 1/2012 | Nakano | |
| 2012/0112972 A1 | 5/2012 | Ogawa | |
| 2012/0154071 A1 | 6/2012 | Bradley | |
| 2012/0229360 A1 | 9/2012 | Jagielski | |
| 2012/0314734 A1* | 12/2012 | Zierdt | H03H 7/0115 375/219 |
| 2013/0033410 A1 | 2/2013 | Wong | |
| 2013/0214812 A1 | 8/2013 | Koo | |
| 2013/0307742 A1* | 11/2013 | Hu | H01Q 1/243 343/821 |
| 2013/0314288 A1* | 11/2013 | Tayrani | G01S 7/034 343/859 |
| 2013/0334215 A1* | 12/2013 | Chen | H05B 6/687 219/705 |
| 2013/0341411 A1 | 12/2013 | Kai | |
| 2013/0342421 A1 | 12/2013 | Katz | |
| 2014/0111381 A1 | 4/2014 | Lee | |
| 2014/0111382 A1 | 4/2014 | Lee | |
| 2014/0113679 A1 | 4/2014 | Wehrmann | |
| 2014/0125540 A1 | 5/2014 | Tetsuno | |
| 2014/0125548 A1 | 5/2014 | Jouanlanne | |
| 2014/0125552 A1 | 5/2014 | Takisawa | |
| 2014/0320351 A1 | 10/2014 | Wei | |
| 2014/0327494 A1 | 11/2014 | Sato | |
| 2014/0375507 A1 | 12/2014 | Lin | |
| 2014/0375527 A1 | 12/2014 | Rutfors | |
| 2015/0022402 A1 | 1/2015 | Gavilan | |
| 2015/0048896 A1 | 2/2015 | Kovac | |
| 2015/0311881 A1 | 10/2015 | Nagumo | |
| 2015/0349726 A1 | 12/2015 | Han et al. | |
| 2016/0156335 A1 | 6/2016 | Takeuchi | |
| 2016/0164474 A1 | 6/2016 | Beltran | |
| 2016/0268992 A1 | 9/2016 | Salfelner | |
| 2016/0336649 A1 | 11/2016 | Yu | |
| 2017/0054214 A1 | 2/2017 | Sanders | |
| 2017/0214378 A1 | 7/2017 | Black | |
| 2017/0244442 A1 | 8/2017 | Mizokami | |
| 2018/0062254 A1 | 3/2018 | Rahikkala | |
| 2018/0123221 A1 | 5/2018 | Finn | |
| 2018/0145410 A1 | 5/2018 | Ban | |
| 2018/0316082 A1 | 11/2018 | Keller | |
| 2019/0190149 A1 | 6/2019 | Vida | |
| 2019/0280383 A1 | 9/2019 | Zolomy | |
| 2020/0127628 A1 | 4/2020 | Zolomy | |

OTHER PUBLICATIONS https://www.electronics-tutorials.ws/accircuits/series-resonance.html., accessed via archive. org on Jun. 12, 2017 (Year: 2017).*
U.S. Appl. No. 15/250,719, filed Aug. 2016, Rahikkala.
U.S. Appl. No. 16/439,458, filed Jun. 2019, Rahikkala.
U.S. Appl. No. 15/823,319, filed Nov. 2017, Zólomy.
U.S. Appl. No. 15/845,327, filed Dec. 2017, Vida.
U.S. Appl. No. 15/845,369, filed Dec. 2017, Vida.
U.S. Appl. No. 16/237,511, filed Dec. 2018, Zólomy.
U.S. Appl. No. 16/237,583, filed Dec. 2018, Zólomy.
U.S. Appl. No. 16/420,111, filed May 2019, Voor.
U.S. Appl. No. 16/420,116, filed Feb. 2019, Zólomy.
U.S. Appl. No. 16/724,160, filed Dec. 2019, Zólomy.
U.S. Appl. No. 17/491,195, filed Sep. 2021, Hänninen.
U.S. Appl. No. 17/491,221, filed Sep. 2021, Rahikkala.
Johanson Technology, *High Frequency Ceramic Solutions*, 4 pgs., 2016.

(56) References Cited

OTHER PUBLICATIONS

Johanson Technology, *High Frequency Ceramic Solutions*, 4 pgs., 2014.
An91445, *Antenna Design and RF Layout Guidelines*, Cypress, 60 pgs., 2014-2016.
Amotech Co., Ltd., *Datasheet*, 8 pgs., 2009.
Office communication in U.S. Appl. No. 15/250,719, 9 pgs.
Office communication in U.S. Appl. No. 15/250,719, 8 pgs.
Office communication in U.S. Appl. No. 15/823,319, 18 pgs.
Office communication in U.S. Appl. No. 15/823,319, 29 pgs.
Office communication in U.S. Appl. No. 15/823,319, 32 pgs.
Office communication in U.S. Appl. No. 15/823,319, 16 pgs.
AN923: EFR32 sub-GHz Matching Guide, Silicon Labs, Jun. 29, 2016, 25 pgs.
D.C. Youla, A New Theory of Broad-band Matching, IEE Transactions on Circuit Theory, Mar. 1964, 21 pgs.
Károly Géher: Linear Networks, 4th edition 1979, Hungarian Technical Book Press (pp. 434-436; translated portions included).
AN643: Si446x/Si4362 RX LNA Matching, Silicon Labs, 2014, 26 pgs.
Office communication in U.S. Appl. No. 15/845,327, 12 pgs.
Office communication in U.S. Appl. No. 15/845,327, 18 pgs.
Office communication in U.S. Appl. No. 15/845,327, 15 pgs.
Office communication in U.S. Appl. No. 15/845,327, 14 pgs.
Web page, "3.1 Multi-band Sub-1GHz tunable RF sub-system for smart meters" (Apr. 27, 2017, 2 pgs.), available at https://training.ti.com/multi-band-sub-1ghz-tunable-rf-sub-system-smart-meters.
Office communication in U.S. Appl. No. 16/237,511, 10 pgs.
Office communication in U.S. Appl. No. 16/237,511, 14 pgs.
Office communication in U.S. Appl. No. 16/237,583, 10 pgs.
Office communication in U.S. Appl. No. 16/237,583, 8 pgs.
Office communication in U.S. Appl. No. 16/237,583, 9 pgs.
Office communication in U.S. Appl. No. 16/420,111, 9 pgs.
Office communication in U.S. Appl. No. 16/420,111, 10 pgs.
Office communication in U.S. Appl. No. 16/420,116, 9 pgs.
Office communication in U.S. Appl. No. 16/420,116, 7 pgs.
Office communication in U.S. Appl. No. 16/724,160, 8 pgs.
AN427: EZ Radio Pro™ Si433X & Si443X RX LNA Matching, Silicon Labs, 2009, 22 pgs.
Liu et al., Excitation Techniques of Loop Current Mode of Ground Antenna, 2011 Cross Strait Quad Regional Radio Science and Wireless Technology Conference, 2011, 4 pgs.
Zahid et al., Analysis of a loop type ground radiation antenna based on equivalent circuit model, IET Microwave, Antennas & Propagation Journal, 2016, 6 pgs.
Cho et al., Loop-type ground antenna using capacitor, Electronics Letters, Jan. 6, 2011, vol. 47, No. 1, 1 pg.
Zhang et al., Bandwidth enhancement of ground antenna using resonant feeding circuit, Electronics Letters, Mar. 28, 2013, vol. 49, No. 7, 2 pgs.
Qu et al., Circular Polarized Ground Radiation Antenna for Mobile Applications, IEEE Transactions on Antennas and Propagation, vol. 66, No. 5, May 2018, pp. 2655-2660.
Zahid et al., Decoupler Deign for MIMO Antennas of USB Dongle Applications Using Ground Mode Coupling Analysis, Progress in Electromagnetics Research M, vol. 76, 113-122, 2018, 10 pgs.
Liu et al., Loop-Type Ground Radiation Antenna for Dual-Band WLAN Applications, IEEE Transactions on Antennas and Propagation, vol. 61, No. 9, Sep. 2013, pp. 4819-4823.
Qu et al., Compact dual-band antenna using inverted-L loop and inner rectangular loop for Electronics Letters, Nov. 5, 2015, vol. 51, No. 23, pp. 1843-1844.
Liu et al., Excitation Techniques of Loop Current Mode of Ground Antenna, 2011 Cross Strait Quad-Regional Radio Science and Wireless Technology Conference, 2011, pp. 1732-1735.
Qu et al., Performance enhancement of ground radiation antenna for Z-wave applications using tunable metal loads, Electronics Letters, Oct. 27, 2016, vol. 52, No. 22, pp. 1827-1828.
Shin et al., Ground Radiation Antenna using Magnetic Coupling Structure, IEEE (date unknown, but before filing of the instant application), 3 pgs.
Qu et al., Ground Radiation Antenna for Mobile Devices, IEEE, 2017, 3 pgs.
Xu et al., Improvement of ground radiation antenna performance using compact EBG in presence of battery effects, Electronics Letters, Jun. 28, 2018, vol. 54, No. 13, pp. 789-800.
Qu et al., Decoupling between ground radiation antennas with ground-coupled loop-type isolator for WLAN applications, IET Microwaves, Antennas & Propagation, 2018, pp. 546-552.
Liu et al., Loop-type ground antenna using resonated loop feeding, intended for mobile devices, Electronics Letters, Mar. 31, 2011, vol. 47, No. 7, 2 pgs.
Piao et al., MIMO Ground-Radiation Antennas Using a Novel Closed-Decoupling-Loop for 5G Applications, IEEE 2020, pp. 142714-142724.
Kim et al., Miniaturized dual-band loop-type ground radiation antenna with enhanced bandwidth for mobile devices, Microw Opt Technol Lett., 2019, pp. 239-243.
Zahid et al., Performance evaluation of loop-type ground radiation antenna based on its optimum impedance level, Electronics Letters, Mar. 30, 2017, vol. 53, No. 7, pp. 446-448.
Hassan et al., A wideband loop-type ground radiation antenna using ground mode tuning and optimum impedance level, Microw Opt Technol Lett., 2019, pp. 1-6.
Johanson Technology, *High Frequency Ceramic Solutions*, 5 pgs., Oct. 12, 2020.
Office communication in U.S. Appl. No. 15/845,369, 17 pgs.
Office communication in U.S. Appl. No. 15/845,369, 15 pgs.
Office communication in U.S. Appl. No. 15/845,369, 12 pgs.
Office communication in U.S. Appl. No. 16/237,511, 15 pgs.
Office communication in U.S. Appl. No. 16/724,160, 28 pgs.
Search report in CN application 201911132444X, 2 pgs.
Office communication in U.S. Appl. No. 15/845,327, 3 pgs.
Office communication in U.S. Appl. No. 16/237,511, 22 pgs.
Office communication in U.S. Appl. No. 15/845,327, 6 pgs.
Office communication in U.S. Appl. No. 15/845,369, 10 pgs.
Office communication in U.S. Appl. No. 16/237,511, 31 pgs.
Office communication in U.S. Appl. No. 17/705,260, 7 pgs.
Office communication in U.S. Appl. No. 17/705,260, 9 pgs.

* cited by examiner

RADIO-FREQUENCY APPARATUS WITH MULTI-BAND WIDEBAND BALUN AND ASSOCIATED METHODS

CROSS-REFERENCE TO RELATED APPLICATIONS

This application is a continuation-in-part (CIP) of the following applications, where are hereby incorporated by reference in their entireties for all purposes: (1) U.S. patent application Ser. No. 15/823,319, filed on Nov. 27, 2017, titled "Apparatus for Radio-Frequency Matching Networks and Associated Methods,"; (2) U.S. patent application Ser. No. 15/845,327, filed on Dec. 18, 2017, titled "Radio-Frequency Apparatus with Multi-Band Balun and Associated Methods,"; and (3) U.S. patent application Ser. No. 15/845,369, filed on Dec. 18, 2017, titled "Radio-Frequency Apparatus with Multi-Band Balun with Improved Performance and Associated Methods,".

TECHNICAL FIELD

The disclosure relates generally to radio-frequency (RF) apparatus and, more particularly, to apparatus for multi-band matching baluns with improved performance, and associated methods.

BACKGROUND

With the increasing proliferation of wireless technology, such as Wi-Fi, Bluetooth, and mobile or wireless Internet of things (IoT) devices, more devices or systems incorporate RF circuitry, such as receivers and/or transmitters. To reduce the cost, size, and bill of materials, and to increase the reliability of such devices or systems, various circuits or functions have been integrated into integrated circuits (ICs). For example, ICs typically include receiver and/or transmitter circuitry.

The RF ICs typically work with circuitry external to the IC to provide a wireless solution. Examples of the external circuitry include baluns, matching circuitry, antennas, filters, switches, and the like.

The description in this section and any corresponding figure(s) are included as background information materials. The materials in this section should not be considered as an admission that such materials constitute prior art to the present patent application.

SUMMARY

A variety of apparatus and associated methods are contemplated according to exemplary embodiments.

According to one exemplary embodiment, an apparatus includes an RF apparatus, and a wideband multi-band matching balun. The wideband multi-band matching balun includes a multi-band balun, which includes at least one three-element frequency-dependent resonator (TEFDR). The wideband multi-band matching balun further includes a differential-to-differential matching circuit coupled to the RF apparatus. The differential-to-differential matching circuit includes at least one TEFDR.

According to another exemplary embodiment, an apparatus includes an RF apparatus, and a wideband multi-band matching balun. The wideband multi-band matching balun includes a multi-band balun, which includes four TEFDRs. The wideband multi-band matching balun further includes a differential-to-differential matching circuit coupled to the RF apparatus. The differential-to-differential matching circuit includes a series inductor-capacitor (LC) network, and a pair of TEFDRs coupled to a series LC network.

According to another exemplary embodiment, a method of operating an apparatus that includes a radio-frequency (RF) apparatus includes using a wideband multi-band matching balun that includes a multi-band balun coupled to a differential-to-differential matching circuit. The multi-band balun comprises at least one TEFDR. The differential-to-differential matching circuit includes at least one TEFDR.

BRIEF DESCRIPTION OF THE DRAWINGS

The appended drawings illustrate only exemplary embodiments and therefore should not be considered as limiting the scope of the application or of the claimed subject-matter. Persons of ordinary skill in the art will appreciate that the disclosed concepts lend themselves to other equally effective embodiments. In the drawings, the same numeral designators used in more than one drawing denote the same, similar, or equivalent functionality, components, or blocks.

DETAILED DESCRIPTION

Figure 1:
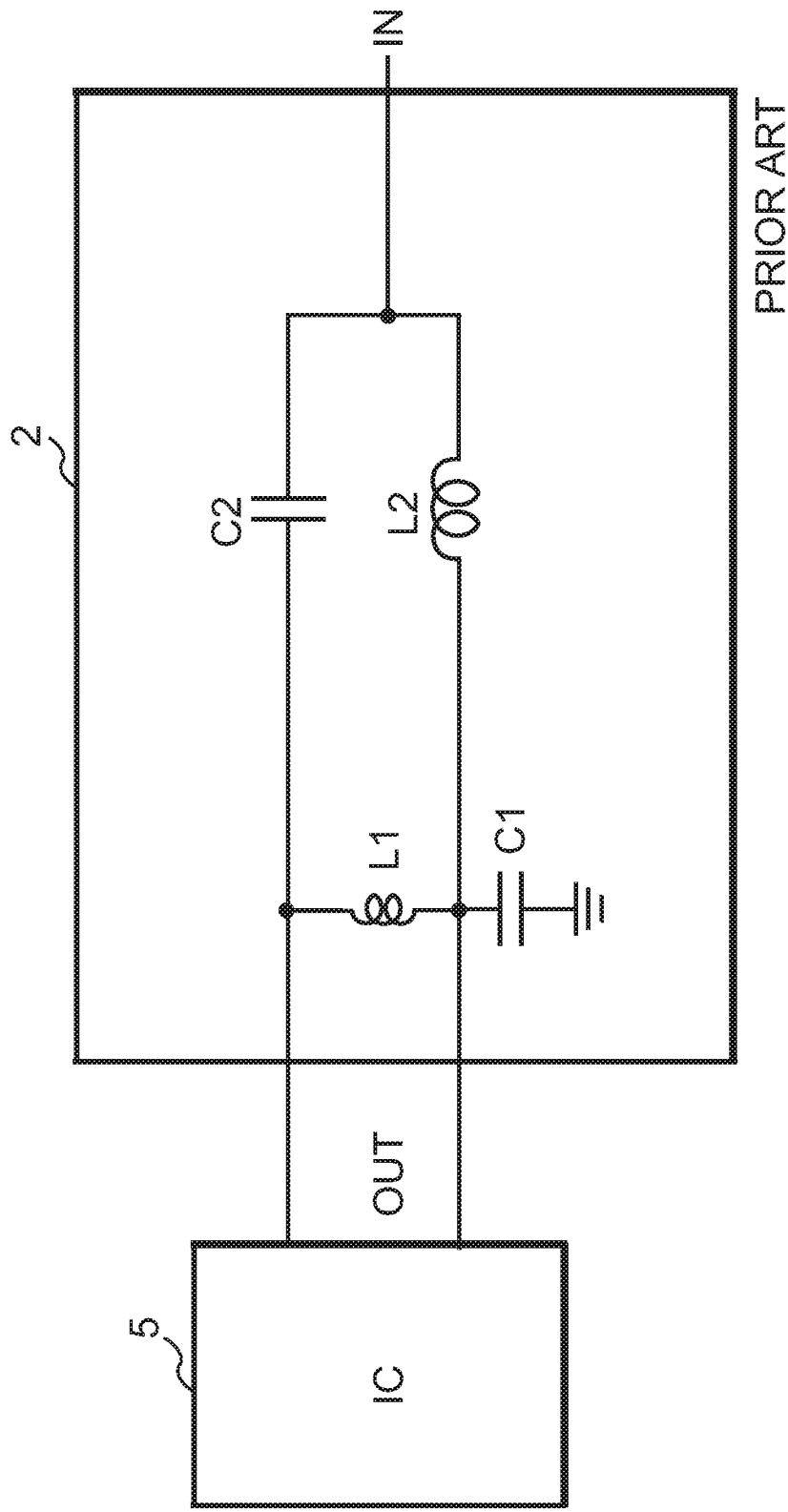
FIG. 1 shows a circuit arrangement using a conventional balun.

The disclosed concepts relate generally to RF apparatus and, more particularly, to multi-band matching baluns, i.e., apparatus that provides the combined functionality of impedance matching circuits (or impedance matching networks or impedance matching circuitry or matching circuit or matching networks or matching circuitry) and baluns, and associated methods.

Impedance matching or impedance transformation circuits are typically used in RF apparatus, such as receivers, transmitters, and/or transceivers, to provide an interface or match between circuitry that have different impedances.

More specifically, in the case of purely resistive impedances, maximum power transfer takes place when the output impedance of a source circuit equals the input impedance of a load circuit. In the case of complex impedances, maximum power transfer takes place when the input impedance of the load circuit is the complex conjugate of the output impedance of the source circuit.

As an example, consider an antenna with a 50-ohm impedance (R=50Ω) coupled to a receive or receiver (RX) circuit with a 50-ohm impedance. In this case, maximum power transfer takes place without the user of an impedance matching circuit because the output impedance of the antenna equals the input impedance of the RX circuit.

Now consider the situation where an antenna with a 50-ohm impedance (R=50Ω) coupled to an RX circuit with a 250-ohm impedance. In this case, because the respective impedances of the antenna and the RX circuit are not equal, maximum power transfer does not take place.

Use of an impedance matching circuit, however, can match the impedance of the antenna to the impedance of the RX circuit. As a result of using the impedance matching circuit, maximum power transfer from the antenna to the RX circuit takes place.

More specifically, the impedance matching circuit is coupled between the antenna and the RX circuit. The impedance matching circuit has two ports, with one port coupled to the antenna, and another port coupled to the RX circuit, respectively.

At the port coupled to the antenna, the impedance matching circuit ideally presents a 50-ohm impedance to the antenna. As a result, maximum power transfer takes place between the antenna and the impedance matching circuit.

Conversely, at the port coupled to the RX circuit, the impedance matching circuit presents a 250-ohm impedance to the RX circuit. Consequently, maximum power transfer takes place between the impedance matching circuit and the RX circuit.

In practice, the impedance matching circuit often fails to perfectly match the impedances. In other words, signal transmission from one network to another is not perfect and 100% of the signal power is not transmitted. As a result, reflection occurs at the interface between circuits or networks with imperfectly matched impedances.

The reflection coefficient, S11, may serve as one measure or figure of merit for the level of impedance matching. A lower S11 denotes better power transmission (better impedance matching), and vice-versa.

As noted, the optimum load impedance (e.g., input impedance of receive circuitry, such as the input impedance of a low-noise amplifier (LNA)) for matching purposes would be the complex conjugate of the source impedance (e.g., an antenna). However, due to the relatively high-Q (quality factor) of the input impedance of the receive circuitry, conjugate impedance match might prove relatively difficult or even impossible. As a compromise, impedances may be matched for maximum voltage gain, i.e., highest impedance where the input capacitance of the LNA (CLNA) is resonated out by the impedance matching circuitry (multi-band matching balun).

Baluns provide a way of interfacing a balanced circuit (e.g., differential input or output) with an unbalanced circuit (e.g., single-ended input or output). Baluns are typically used to interface RX circuits or transmit or transmitter (TX) circuit with differential inputs or outputs, respectively, to a single-ended antenna.

FIG. 1 shows a circuit arrangement using a conventional balun 2 coupled to an IC 5. Balun 2 includes four components or elements, i.e., inductor L1, inductor L12, capacitor C1, and capacitor C12. Balun 2 is typically coupled to RX circuitry (not shown) in IC 5. Balun 2 matches the impedance at the input (say, 50Ω) to the input impedance of the circuitry in IC 5, such as the input impedance of RX circuitry, typically 100-200Ω. Thus, for circuitry with higher input impedance, use of balun 2 results in relatively high impedance mismatch, which in turns results in power loss.

As known to persons of ordinary skill in the art, balun 2 constitutes a single-frequency balun. In other words, balun 2 provides a reasonable S11 value (say, −10 dB) at a single frequency, or within a single relatively narrow frequency band.

Various embodiments according to the disclosure combine the functionality of multi-band matching circuits and the functionality of baluns, i.e., the provide matching baluns. Matching baluns according to various embodiments provide not only impedance matching functionality, but also balun functionality in multiple frequency bands.

In exemplary embodiments, matching baluns and associated methods are disclosed. The matching baluns are relatively low cost, may be used with RF receivers, RF transmitters, and/or RF transceivers. Matching baluns according to various embodiments have relatively high Q (quality factor), and differential TX and/or RX ports.

Furthermore, matching baluns according to various embodiments may be adapted to various operating frequency ranges, power levels, and RX circuit or RX and TX circuit impedances. In addition, matching baluns according to various embodiments may be used with a variety of RX or RX and TX circuit configurations, as desired.

As noted above, matching baluns according to various embodiments realize both the balun and impedance-matching functions (e.g., 50-ohm single-ended to 750-ohm differential) in multiple frequency bands, i.e., the matching baluns can work well simultaneously in two separate bands. In some embodiments, the frequency bands might include 310-370 MHz±10%, 370-434 MHz±10%, and 868-928 MHz±10%.

As persons of ordinary skill in the art will understand, however, the disclosed concepts may be used to provide multi-band matching baluns for other frequency bands. Other frequency bands may be accommodated by making appropriate modifications to the component values used in the multi-band matching baluns, as persons of ordinary skill in the art will understand.

Multi-band matching baluns according to various embodiments use 12, 10, 8, or 6 elements or components (capacitors, inductors), such as lumped surface mount device (SMD) components (or other lumped components). The components are fixed-value components, i.e., they are not and do not include tunable or variable components (i.e., no inductor or capacitor whose inductance or capacitance, respectively, may be varied or tuned), nor are they switchable components, nor do they use multiple paths (i.e., use of more than one path in the RF front-end matching circuit and, thus, multiple inputs and/or outputs for different frequency bands (plus applying couplers, splitters, diplexers, and/or multiplexers) or use of RF switches), as are used conventionally.

In some embodiments, rather than using lumped components, distributed components may be used to realize matching baluns, as desired, and as persons of ordinary skill in the art will understand. Multi-band matching baluns intended for relatively high frequencies, such as over a gigahertz or other desired frequency value, may be realized using distributed components, as persons of ordinary skill in the art will understand.

Some exemplary embodiments are described with component values and/or impedance values and/or configurations for particular frequency bands and/or for particular RX and/or TX circuitry. Such embodiments are merely illustrative and are not intended and should not be construed as limiting the disclosed concepts.

As persons of ordinary skill in the art will understand, the concepts for multi-band matching baluns are not limited to those exemplary or illustrative frequency values or impedance levels (e.g., input impedance of RX circuitry). Multi-band matching baluns that accommodate other frequency bands and/or impedance values may be designed and realized by making appropriate modifications or designing appropriate multi-band matching baluns, as persons of ordinary skill in the art will understand.

Figure 2:
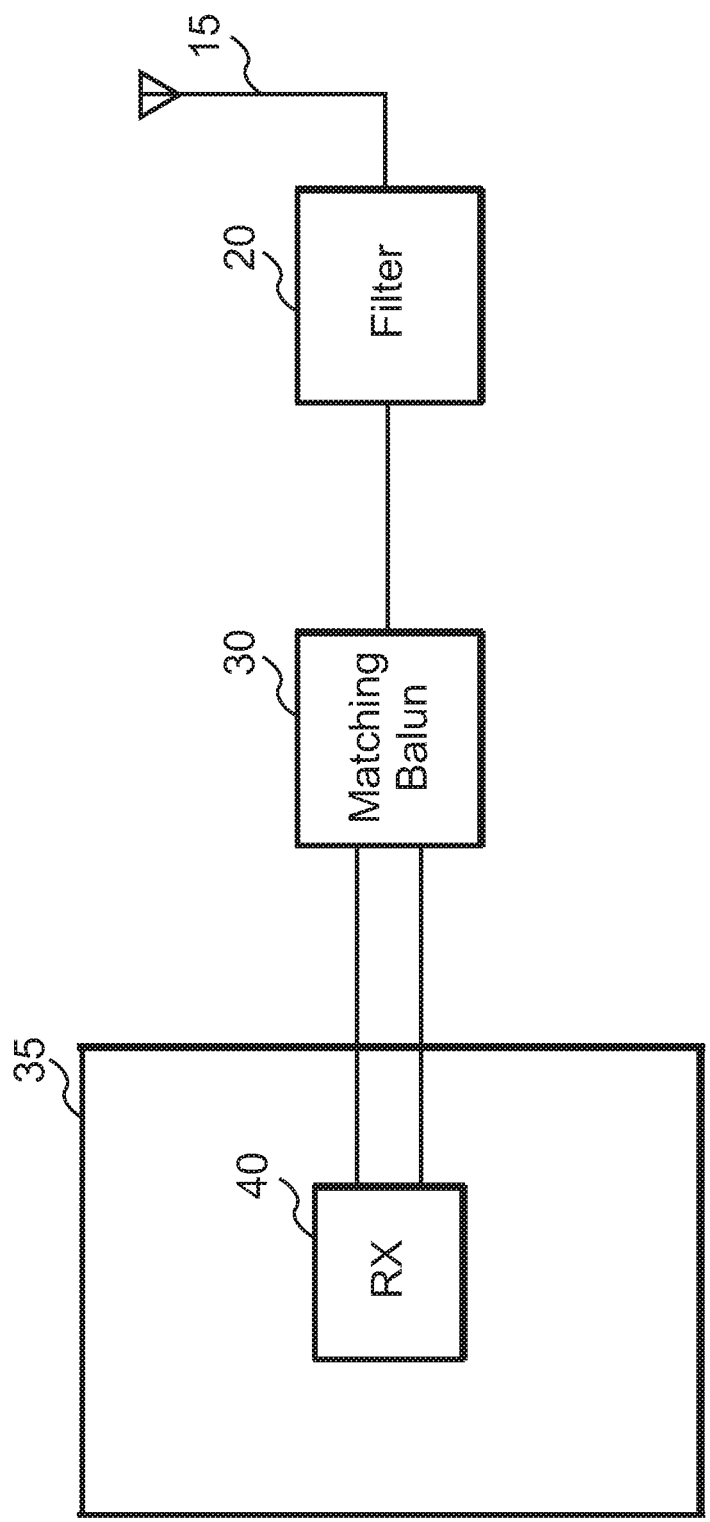
FIG. 2 shows a circuit arrangement for an RF apparatus with a multi-band matching balun according to an exemplary embodiment.

As noted above, multi-band matching baluns according to various embodiments may be used in a variety of apparatus. FIG. 2 shows a circuit arrangement for an RF apparatus with a multi-band matching balun 30 according to an exemplary embodiment.

More specifically, the embodiment in FIG. 2 shows an RF apparatus 35 that has RX functionality, i.e., by using RX circuitry 40. Antenna 15 receives RF signals and provides the signals to filter 20. Filter 20 is coupled to matching balun 30.

Multi-band matching balun 30 matches the output impedance of filter 20 to the input impedance of RX circuitry 40. Multi-band matching balun 30 also provides balun functionality, as described above. More specifically, multi-band matching balun 30 couples or interfaces the single-ended output of filter 20 to the differential input of RX circuitry 40.

Figure 3:
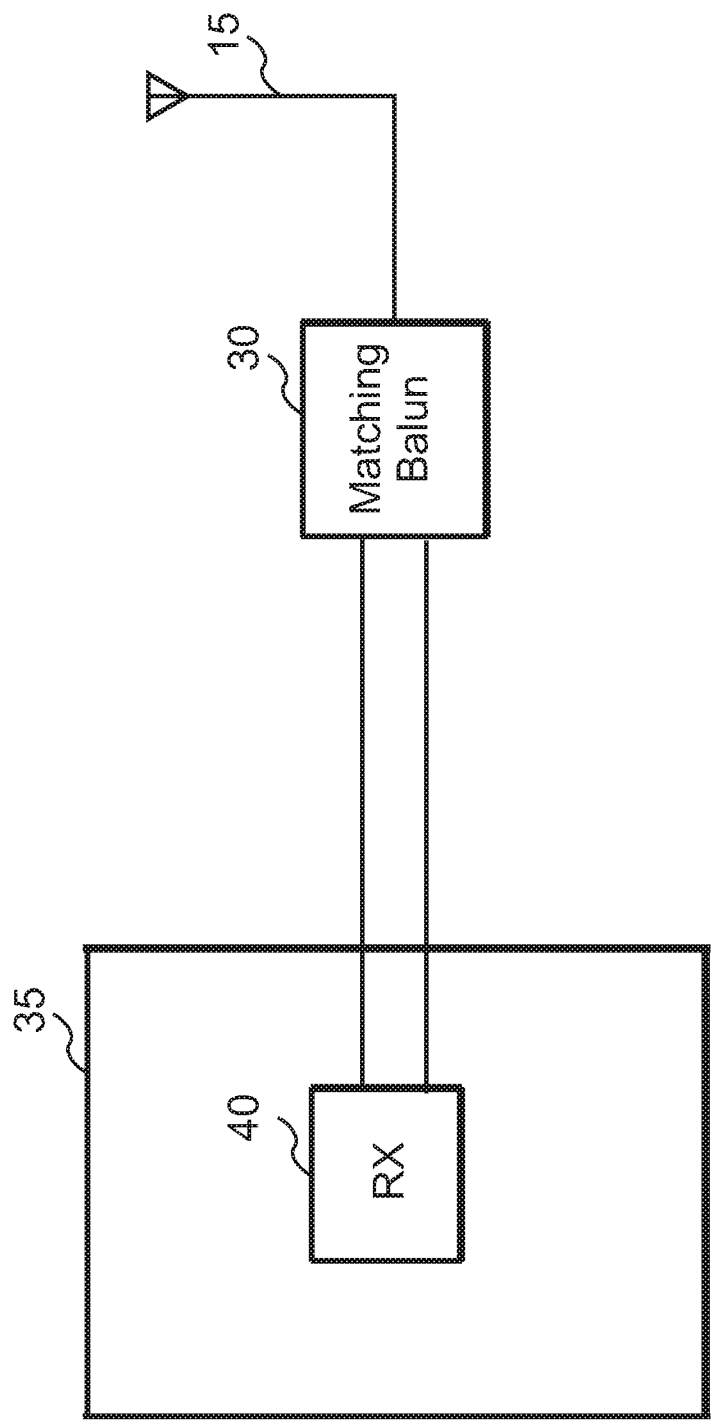
FIG. 3 shows a circuit arrangement for an RF apparatus with a multi-band matching balun according to another exemplary embodiment.

Note that filter 20 is optional in various embodiments, and may be omitted. More specifically, filter 20 is typically used if higher selectivity or blocking is desired. FIG. 3 shows a circuit arrangement for an RF apparatus with a multi-band matching balun 30 according to another exemplary embodiment. In this exemplary embodiment, filter 20 is omitted, and antenna 15 is coupled to multi-band matching balun 30.

Multi-band matching balun 30 matches the impedance of antenna 15 (typically 50Ω) to the input impedance of RX circuitry 40. Multi-band matching balun 30 also provides balun functionality, as described above. More specifically, multi-band matching balun 30 couples or interfaces the single-ended output of antenna 15 to the differential input of RX circuitry 40.

Figure 4:
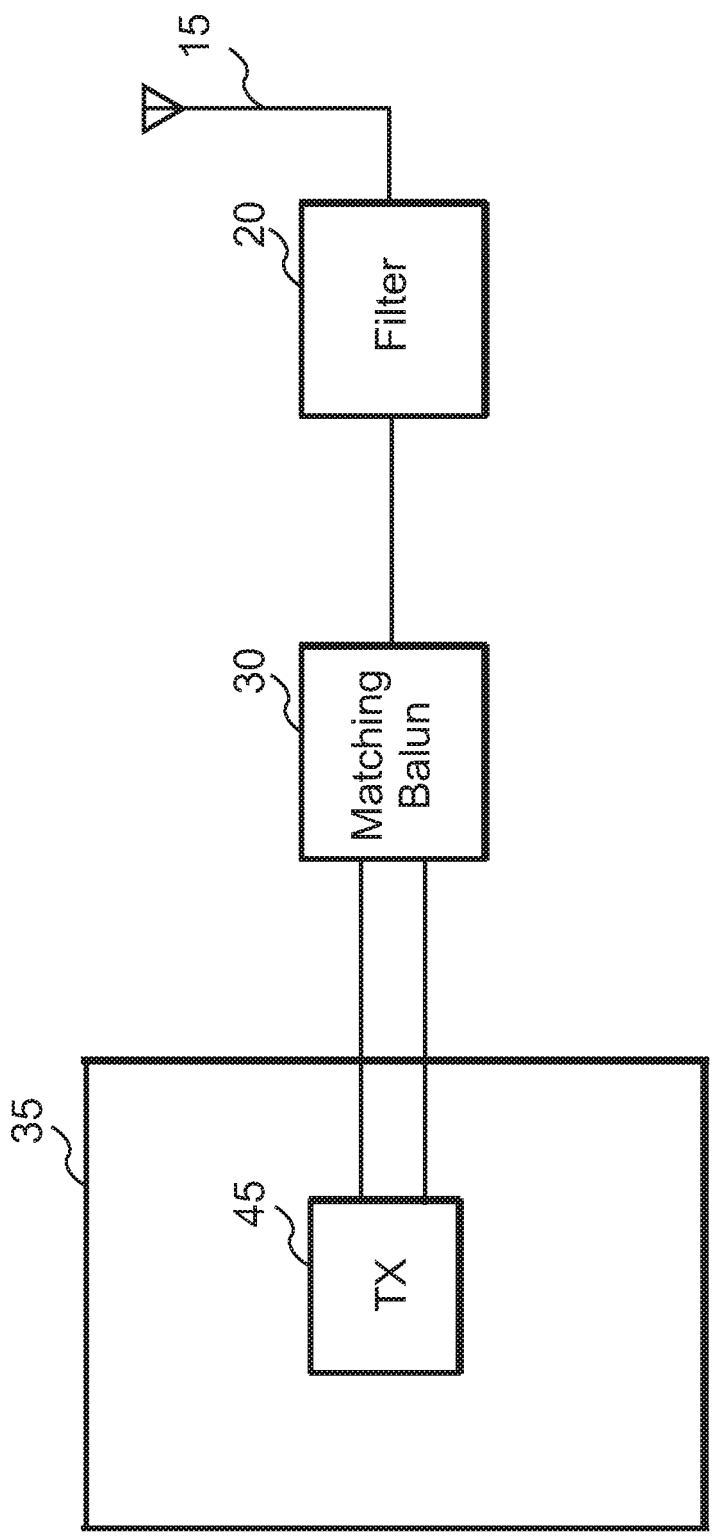
FIG. 4 shows a circuit arrangement for an RF apparatus with a multi-band matching balun according to another exemplary embodiment.

As noted above, multi-band matching baluns according to various embodiments may also be used in RF apparatus that include TX functionality. FIG. 4 shows a circuit arrangement for an RF apparatus that includes TX circuitry 45 and multi-band matching balun 30 according to another exemplary embodiment.

TX circuitry 45 provides RF signals to be transmitted (typically through a power amplifier (not shown) to multi-band matching balun 30. Multi-band matching balun 30 is coupled to filter 20. Filter 20 filters the RF signals, and provides the filtered RF signals to antenna 15. The filtered RF signals are transmitted via antenna 15.

Multi-band matching balun 30 matches the output impedance of TX circuitry 45 to the input impedance of filter 20. Multi-band matching balun 30 also provides balun functionality, as described above. More specifically, multi-band matching balun 30 couples or interfaces the single-ended input of filter 20 to the differential output of TX circuitry 45.

Note that filter 20 is optional in various embodiments, and may be omitted. More specifically, filter 20 is typically used if the TX mode of operation generates higher harmonics than allowed by the applicable or desired standards or are desired.

Figure 5:
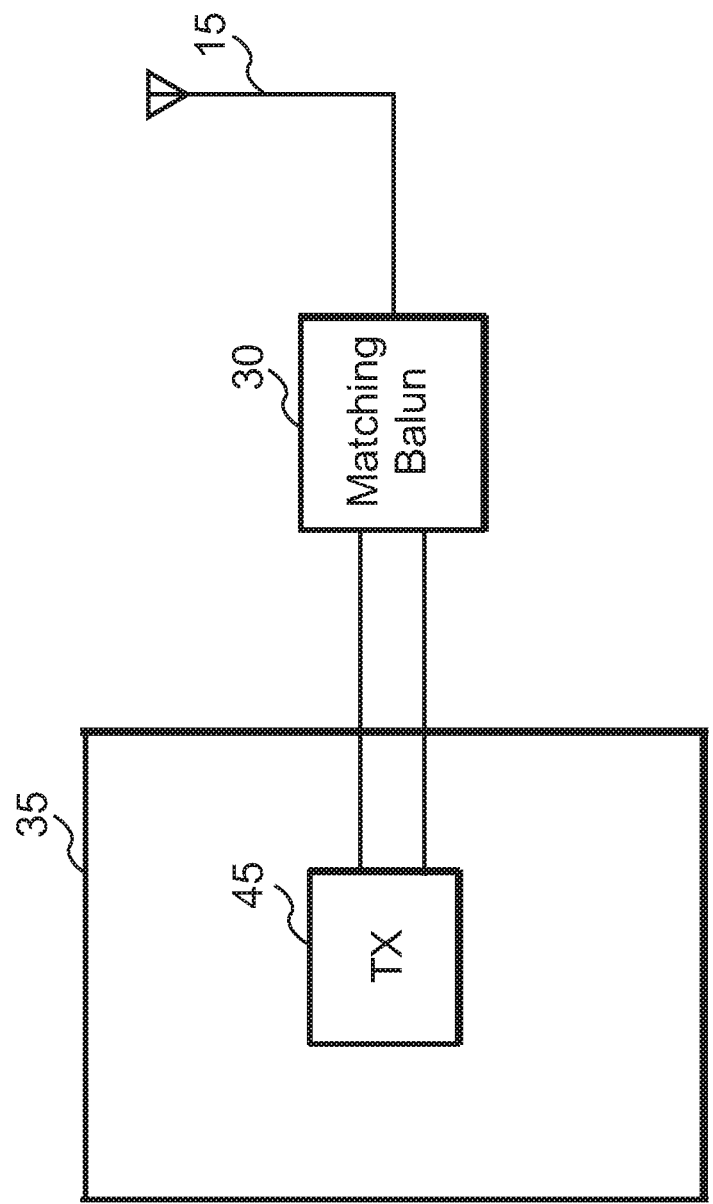
FIG. 5 shows a circuit arrangement for an RF apparatus with a multi-band matching balun according to another exemplary embodiment.

FIG. 5 shows a circuit arrangement for an RF apparatus with a multi-band matching balun 30 according to another exemplary embodiment. In this exemplary embodiment, filter 20 is omitted, and antenna 15 is coupled to multi-band matching balun 30.

Multi-band matching balun 30 matches the impedance of antenna 15 (typically 50Ω) to the output impedance of TX circuitry 45. Multi-band matching balun 30 also provides balun functionality, as described above. More specifically, multi-band matching balun 30 couples or interfaces the single-ended input of antenna 15 to the differential output of TX circuitry 45.

Note that multi-band matching balun 30 may also be used in RF apparatus that have both RX and TX functionality, i.e., transceivers. In such embodiments, various techniques, such as RX-TX switches and/or direct coupling of RX circuitry and TX circuitry to balun/impedance matching circuitry may be used, as persons of ordinary skill in the art will understand. One or more multi-band matching baluns 30 may be used to provide impedance-matching and balun functionality, as described above.

One aspect of the disclosure relates to the use of three-element frequency-dependent resonators (TEFDRs) to realize multi-band matching baluns. In various embodiments, one or more three-element frequency-dependent resonators may be used to replace corresponding component(s) in a balun.

Generally speaking, and as described in more details in connection with the exemplary embodiments shown in the figures, multi-band matching baluns according to various embodiments may use one, two, three, or four TEFDRs, or at least one TEFDR. In addition, the multi-band matching baluns may use zero, one, two, or three reactive lumped elements (LREs), such as inductors or capacitors (e.g., balun 2 in FIG. 1 uses four LREs, i.e., two capacitors, and two inductors), or at most three LREs.

The three-element frequency-dependent resonators use fixed-value (fixed capacitance or inductance value, not variable, tunable, or switchable) components, such as lumped capacitors and/or inductors. The three-element frequency-dependent resonators provide the functionality of an inductor or capacitor. Unlike a fixed-value inductor or capacitor, however, the inductance or capacitance of three-element frequency-dependent resonators varies as a function of frequency without the use of variable, tunable, or switchable inductors or capacitors.

Note that, as described above, rather than using exclusively lumped elements, other arrangements may be used to realize reactive components (inductors, capacitors) in multi-band matching baluns according to various embodiments. Thus, in some embodiments, distributed reactive elements (DREs), such as distributed inductors and/or capacitors, may be used in multi-band matching baluns instead of LREs. In some embodiments, a combination of LREs and DREs may be used, as desired, to implement multi-band matching baluns. Note further that the reactive components or elements may be used either individually (e.g., a capacitor or inductor in a multi-band matching balun), or in combination with other reactive elements to realize TEFDRs (e.g., a capacitor and two inductors used to realize a TEFDR that is used in a multi-band matching balun).

Figure 6:
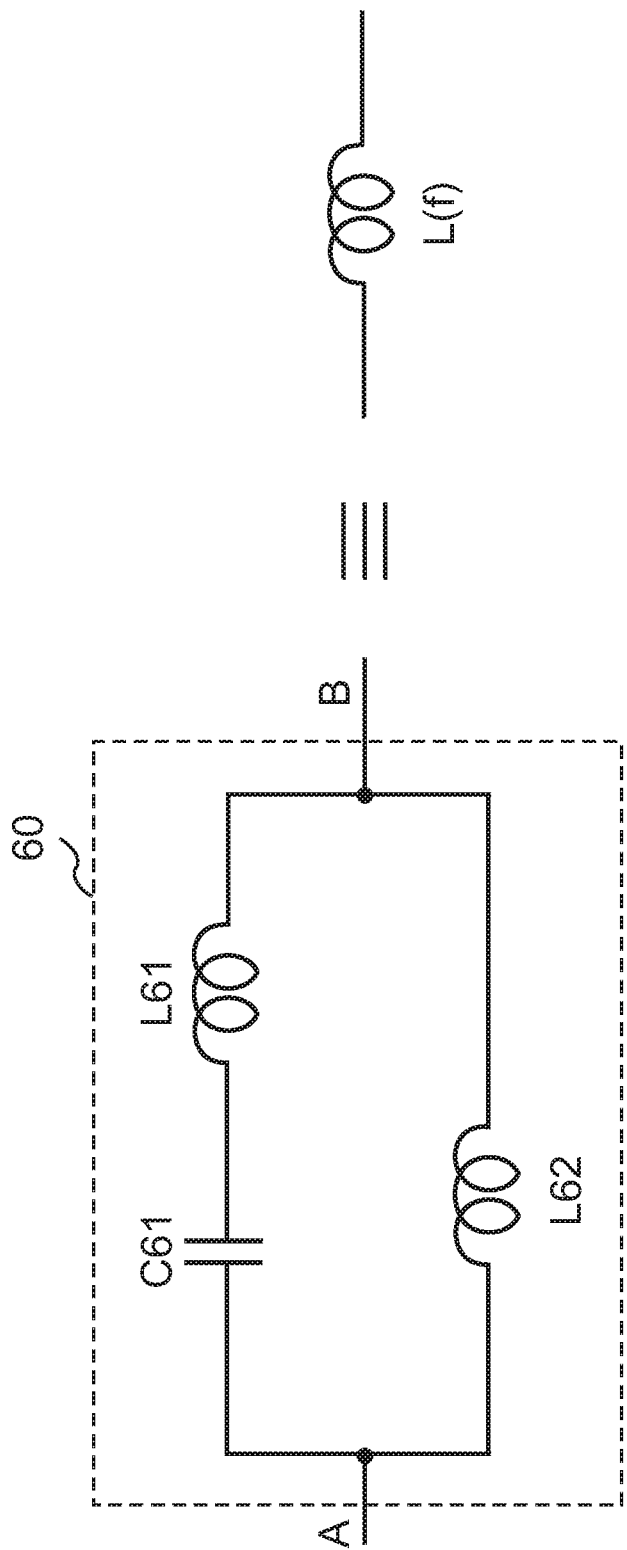
FIG. 6 shows a three-element frequency-dependent resonator according to an exemplary embodiment.
Figure 7:
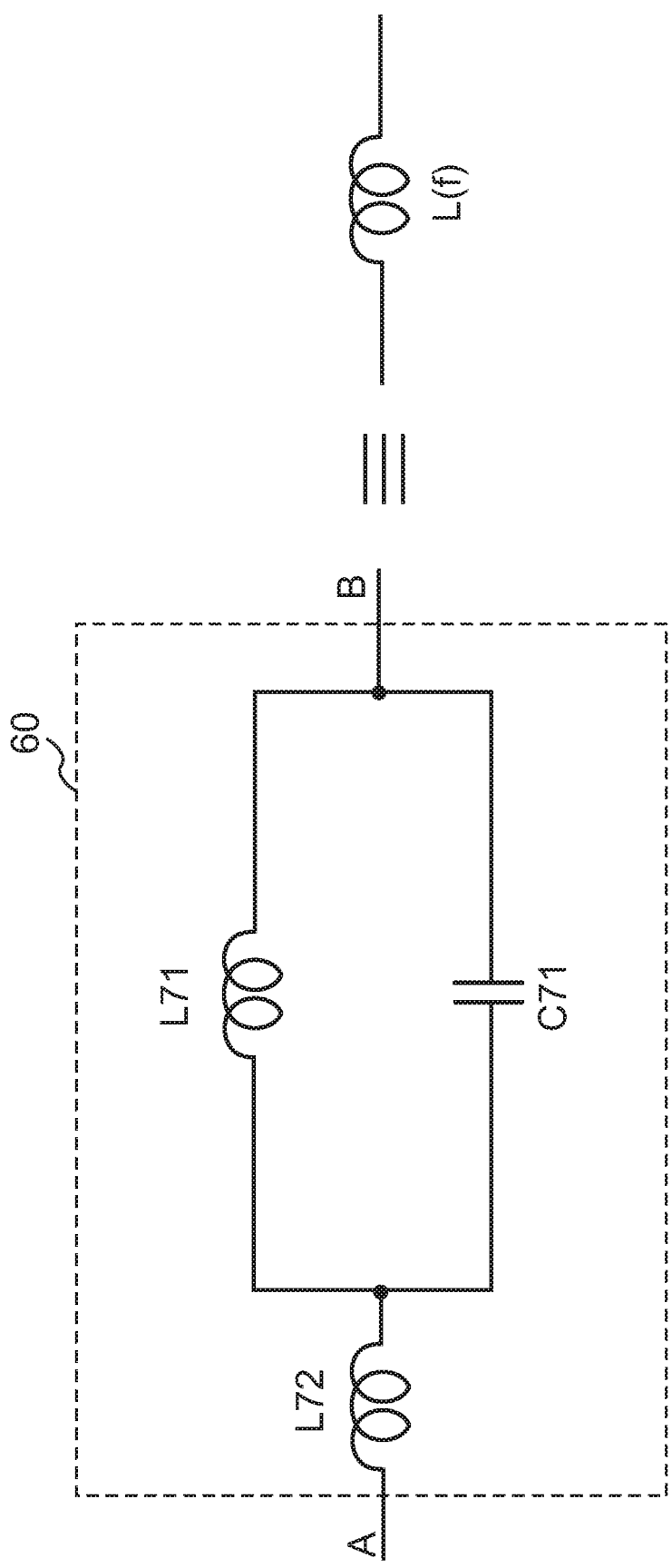
FIG. 7 shows a three-element frequency-dependent resonator according to another exemplary embodiment.
Figure 8:
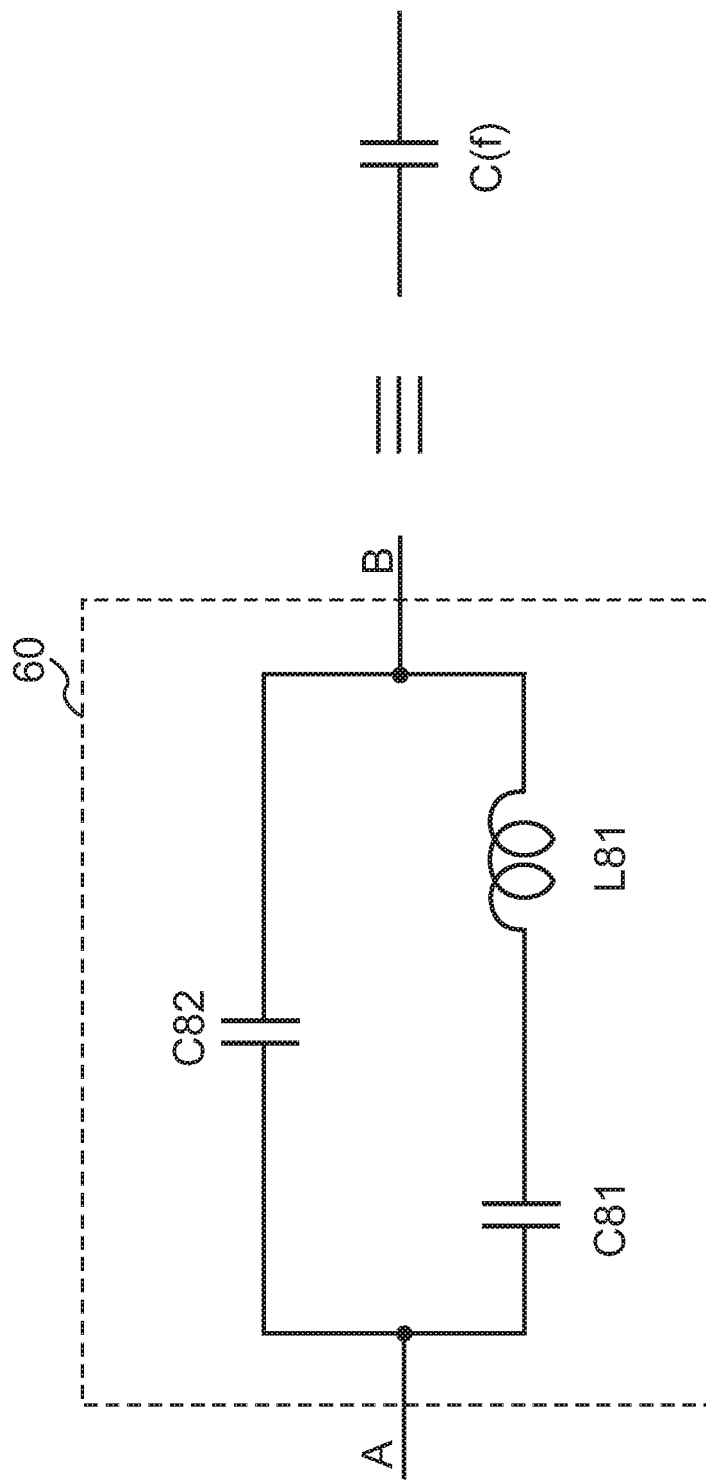
FIG. 8 shows a three-element frequency-dependent resonator according to another exemplary embodiment.
Figure 9:
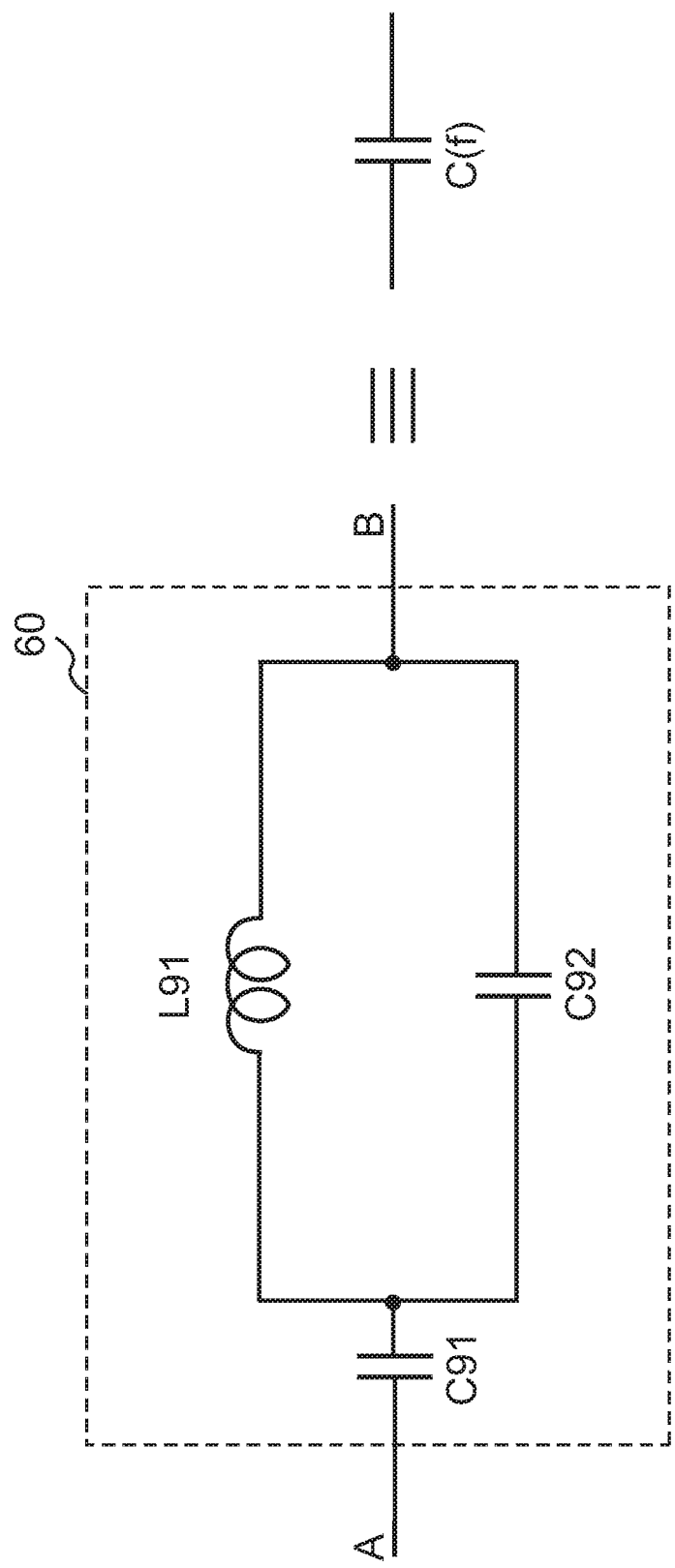
FIG. 9 shows a three-element frequency-dependent resonator according to another exemplary embodiment.

FIGS. 6-9 show three-element frequency-dependent resonators according to exemplary embodiments. More specifically, FIGS. 6-7 show three-element frequency-dependents that may be used to replace an inductor in a balun. Conversely, FIGS. 8-9 show three-element frequency-dependents that may be used to replace a capacitor in a balun, such as balun 2 shown in FIG. 1, in order to realize multi-band matching baluns.

The three-element frequency-dependent resonators can be used as frequency-dependent components (with lower inductance or capacitance at a higher band) and thus they are able to serve as building blocks of more complex circuits, which resonate simultaneously in multiple frequency bands. As a result, by using three-element frequency-dependent resonators, multi-band matching baluns may be realized, as described below in detail.

Referring to FIG. 6, a three-element frequency-dependent resonator 60 is shown coupled between points A and B. Three-element frequency-dependent resonator 60 includes capacitor C61, inductor L61, and inductor L62, all of which have fixed (not variable, tunable, or switchable) capacitance and inductance values, respectively, and may be realized by using lumped components, as described above.

Capacitor C61 is coupled to point A and also in series with inductor L61. Inductor L61 is also coupled to point B. Inductor L62 is coupled between points A and B, i.e., in parallel with the series combination of capacitor C61 and inductor L61.

As shown, the three-element frequency-dependent resonator 60 is equivalent to an inductor L(f), where "(f)" denotes dependence of inductance on frequency, i.e., the inductance of L(f) is a function of frequency. Unlike a traditional inductor, the inductance of three-element frequency-dependent resonator 60 varies as a function of frequency. The following formulas provide a technique for calculating the values of the components in three-element frequency-dependent resonator 60 (with L1 corresponding to L62, C3 corresponding to C61, and L3 corresponding to L61 in the figure):

$$Z = j*2\pi f*L1*\frac{1-(2\pi f)^2*L3*C3}{1-(2\pi f)^2*C3*(L1+L3)}$$

$$\omega_x = 2\pi f_x$$

$$L3 = \frac{X1*X2}{X1-X2}*\frac{\omega_1^2-\omega_2^2}{\omega_0^2-\omega_1^2-\omega_2^2+\frac{\omega_1^2\omega_2^2}{\omega_0^2}}$$

$$L1 = X1*\frac{\omega_0^2-\omega_1^2}{\omega_0^2-\omega_1^2+\frac{\omega_1^2*X1}{L3}}$$

$$C3 = \frac{1}{\omega_0^2*L3}$$

where Z, j, f, L1, L3, C3, and w denote, respectively, impedance, the imaginary unit, frequency, the inductance of the L1 component, the inductance of the L3 component, the capacitance of the C3 component, and the angular frequency. X1 denotes the desired inductance at $f_1$, and X2 denotes the desired inductance at $f_2$, where $f_1 < f_2$, X1>X2, and Z=jωX, and where $\omega_1 < \omega_o < \omega_2$. The quantity $f_o$ is the series resonant point, which should be at the frequency $(f_1+f_2)/2$, but other values—between $f_1$ and $f_2$—may be used, as desired.

Referring to FIG. 7, a three-element frequency-dependent resonator 60 is shown coupled between points A and B. Three-element frequency-dependent resonator 60 includes capacitor C71, inductor L71, and inductor L72, all of which have fixed (not variable, tunable, or switchable) capacitance and inductance values, respectively, and may be realized by using lumped components, as described above.

The parallel combination of capacitor C71 and inductor L71 is coupled to inductor L72 and to point B. Inductor L72 is also coupled to point A.

As shown, the three-element frequency-dependent resonator is equivalent to an inductor L(f), where "(f)" denotes dependence of inductance on frequency, i.e., the inductance of L(f) is a function of frequency. Unlike a traditional inductor, the inductance of three-element frequency-dependent resonator 60 varies as a function of frequency. The following formulas provide a technique for calculating the values of the components in three-element frequency-dependent resonator 60 (with L1 corresponding to L72, C3 corresponding to C71, and L3 corresponding to L71 in the figure):

$$Z = j*2\pi f*\left(L1+\frac{L3}{1-(2\pi f)^2*L3*C3}\right)$$

-continued $$\omega_x = 2\pi f_x$$

$$L3 = \frac{X1 * X2}{\frac{\omega_0^2}{\omega_0^2 - \omega_1^2} - \frac{\omega_0^2}{\omega_0^2 - \omega_2^2}}$$

$$L1 = X2 - L3 * \frac{\omega_0^2}{\omega_0^2 - \omega_2^2}$$

$$C3 = \frac{1}{\omega_0^2 * L3}$$

where Z, j, f, L1, L3, C3, and w denote, respectively, impedance, the imaginary unit, frequency, the inductance of the L1 component, the inductance of the L3 component, the capacitance of the C3 component, and the angular frequency. X1 denotes the desired inductance at $f_1$, and X2 denotes the desired inductance at $f_2$, where $f_1 < f_2$, X1>X2, and Z=jωX, and where $\omega_1 < \omega_o < \omega_2$. The quantity $f_o$ is the parallel resonant point, which should be at the frequency $(f_1+f_2)/2$, but other values—between $f_1$ and $f_2$—may be used, as desired.

As noted above, FIGS. 8-9 show three-element frequency-dependents that may be used to replace a capacitor, e.g., a capacitor used in a balun, such as balun 2 in FIG. 1. Referring to FIG. 8, a three-element frequency-dependent resonator 60 is shown coupled between points A and B. Three-element frequency-dependent resonator 60 includes capacitor C81, inductor L81, and capacitor C82, all of which have fixed (not variable, tunable, or switchable) capacitance and inductance values, respectively, and may be realized by using lumped components, as described above.

Capacitor C81 is coupled to point A and also in series with inductor L81. Inductor L81 is also coupled to point B. Capacitor C82 is coupled between points A and B, i.e., in parallel with the series combination of capacitor C81 and inductor L81.

As shown, three-element frequency-dependent resonator 60 is equivalent to a capacitor C. However, unlike a traditional capacitor, the capacitance of the three-element frequency-dependent resonator varies as a function of frequency. The values of capacitor C81, inductor L81, and capacitor C82 may be calculated as follows (with C1 corresponding to C82, C3 corresponding to C81, and L3 corresponding to L81 in the figure):

$$Y = j * 2\pi f * \left( C1 + \frac{C3}{1 - (2\pi f)^2 * L3 * C3} \right)$$

$$\omega_x = 2\pi f_x$$

$$C3 = \frac{B1 - B2}{\frac{\omega_0^2}{\omega_0^2 - \omega_1^2} - \frac{\omega_0^2}{\omega_0^2 - \omega_2^2}}$$

$$C1 = B2 - C3 * \frac{\omega_0^2}{\omega_0^2 - \omega_2^2}$$

$$L3 = \frac{1}{\omega_0^2 * C3}$$

where Y, j, f, C1, L3, C3, and w denote, respectively, admittance, the imaginary unit, frequency, the capacitance of the C1 component, the inductance of the L3 component, the capacitance of the C3 component, and the angular frequency. B1 denotes the desired capacitance at $f_1$, and B2 denotes the desired capacitance at $f_2$, where $f_1 < f_2$, B1>B2, and Y=jωB, and where $\omega_1 < \omega_o < \omega_2$. The quantity $f_o$ is the series resonant point, which should be at the frequency $(f_1+f_2)/2$, but other values—between $f_1$ and $f_2$—may be used, as desired.

Referring to FIG. 9, a three-element frequency-dependent resonator 60 is shown coupled between points A and B. Three-element frequency-dependent resonator 60 includes capacitor C91, inductor L91, and capacitor C92, all of which have fixed (not variable, tunable, or switchable) capacitance and inductance values, respectively, and may be realized by using lumped components, as described above.

The parallel combination of capacitor C92 and inductor L91 is coupled to capacitor C91 and to point B. Capacitor C91 is also coupled to point A.

As shown, three-element frequency-dependent resonator 60 is equivalent to a capacitor C(f), where "(f)" denotes dependence of capacitance on frequency, i.e., the capacitance of C(f) is a function of frequency. Unlike a traditional capacitor, the capacitance of three-element frequency-dependent resonator 60 varies as a function of frequency. The values of capacitor C91, inductor L91, and capacitor C92 may be calculated as follows (with C1 corresponding to C91, C3 corresponding to C92, and L3 corresponding to L91 in the figure):

$$Y = j * 2\pi f * C1 * \frac{1 - (2\pi f)^2 * L3 * C3}{1 - (2\pi f)^2 * L3 * (C1 + C3)}$$

$$\omega_x = 2\pi f_x$$

$$C3 = \frac{B1 * B2}{B1 - B2} * \frac{\omega_1^2 - \omega_2^2}{\omega_0^2 - \omega_1^2 - \omega_2^2 + \frac{\omega_1^2 \omega_2^2}{\omega_0^2}}$$

$$C1 = B1 * \frac{\omega_0^2 - \omega_1^2}{\omega_0^2 - \omega_1^2 + \frac{\omega_1^2 * B1}{C3}}$$

$$L3 = \frac{1}{\omega_0^2 * C3}$$

where Y, j, f, C1, L3, C3, and w denote, respectively, admittance, the imaginary unit, frequency, the capacitance of the C1 component, the inductance of the L3 component, the capacitance of the C3 component, and the angular frequency. B1 denotes the desired capacitance at $f_1$, and B2 denotes the desired capacitance at $f_2$, where $f_1 < f_2$, B1>B2, and Y=jωB, and where $\omega_1 < \omega_o < \omega_2$. The quantity $f_o$ is the parallel resonant point, which should be at the frequency $(f_1+f_2)/2$, but other values—between $f_1$ and $f_2$—may be used, as desired.

As noted above, three-element frequency-dependent resonators 60 may be used to implement multi-band matching baluns. As noted above, in various embodiments, one through four TEFDRs and zero through three LREs (or reactive elements or components, generally) are used to realize multi-band matching baluns.

Figure 10:
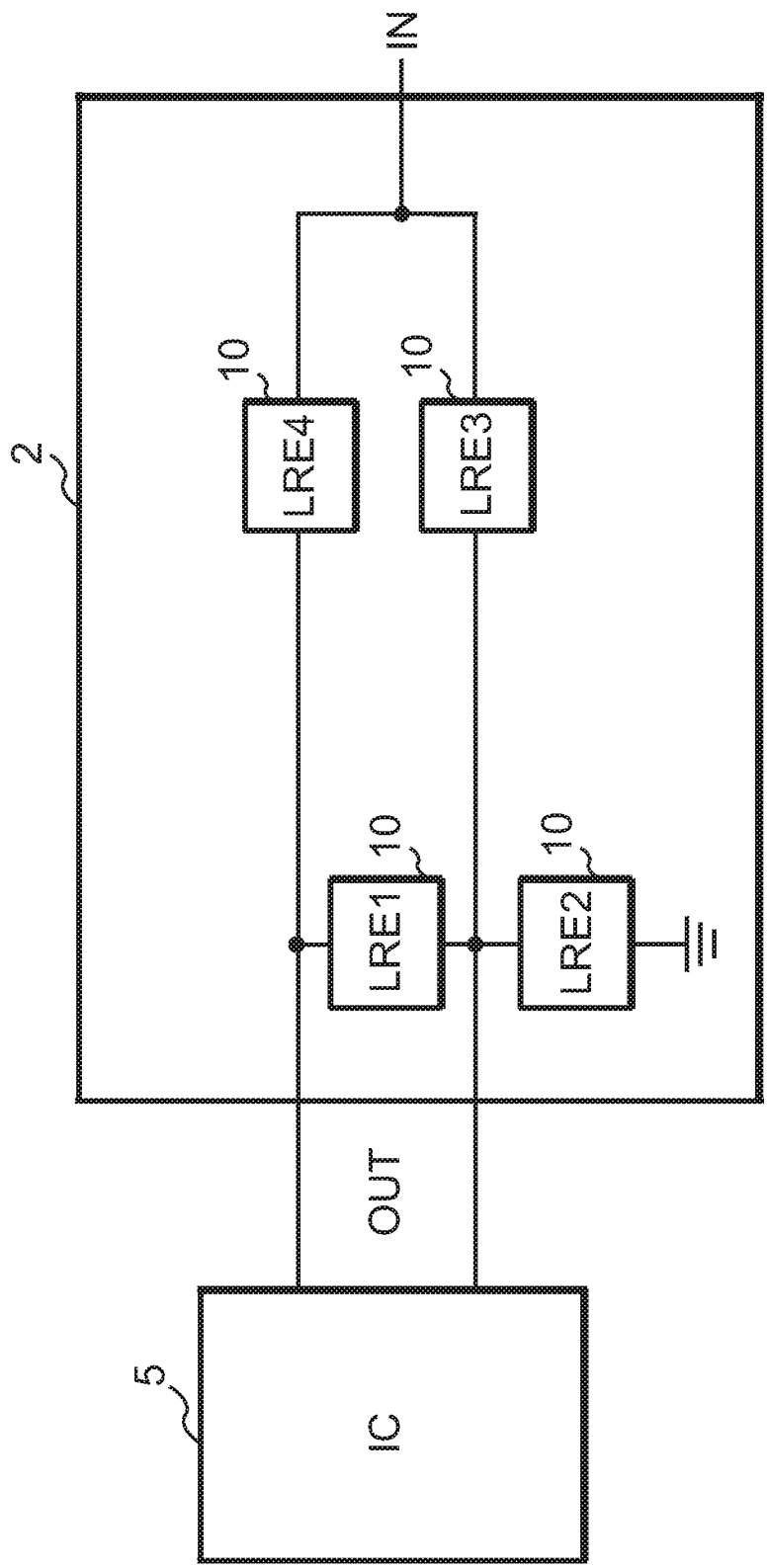
FIG. 10 shows a circuit arrangement for a balun with lumped reactive elements.

Generally speaking, multi-band matching baluns according to various embodiments are obtained by replacing one or more LREs in the circuit shown in FIG. 10. More specifically, balun 2 in FIG. 10 illustrates the balun of FIG. 1, but with the individual capacitors and inductors replaced with LREs. By replacing one, two, three, or four of the LREs with TEFDRs, multi-band matching baluns according to various embodiments are obtained.

One aspect of the disclosure relates to 12-element multi-band matching baluns. Twelve-element multi-band matching baluns are obtained by replacing all four LREs in FIG. 10 with TEFDRs. The TEFDRs may be any of the TEFDRs shown in FIGS. 6-9. Depending on the choice of TEFDRs to replace the LREs in FIG. 10, multi-band matching baluns with different and/or desired characteristics (e.g., frequency bands of operation) may be obtained.

Figure 11:
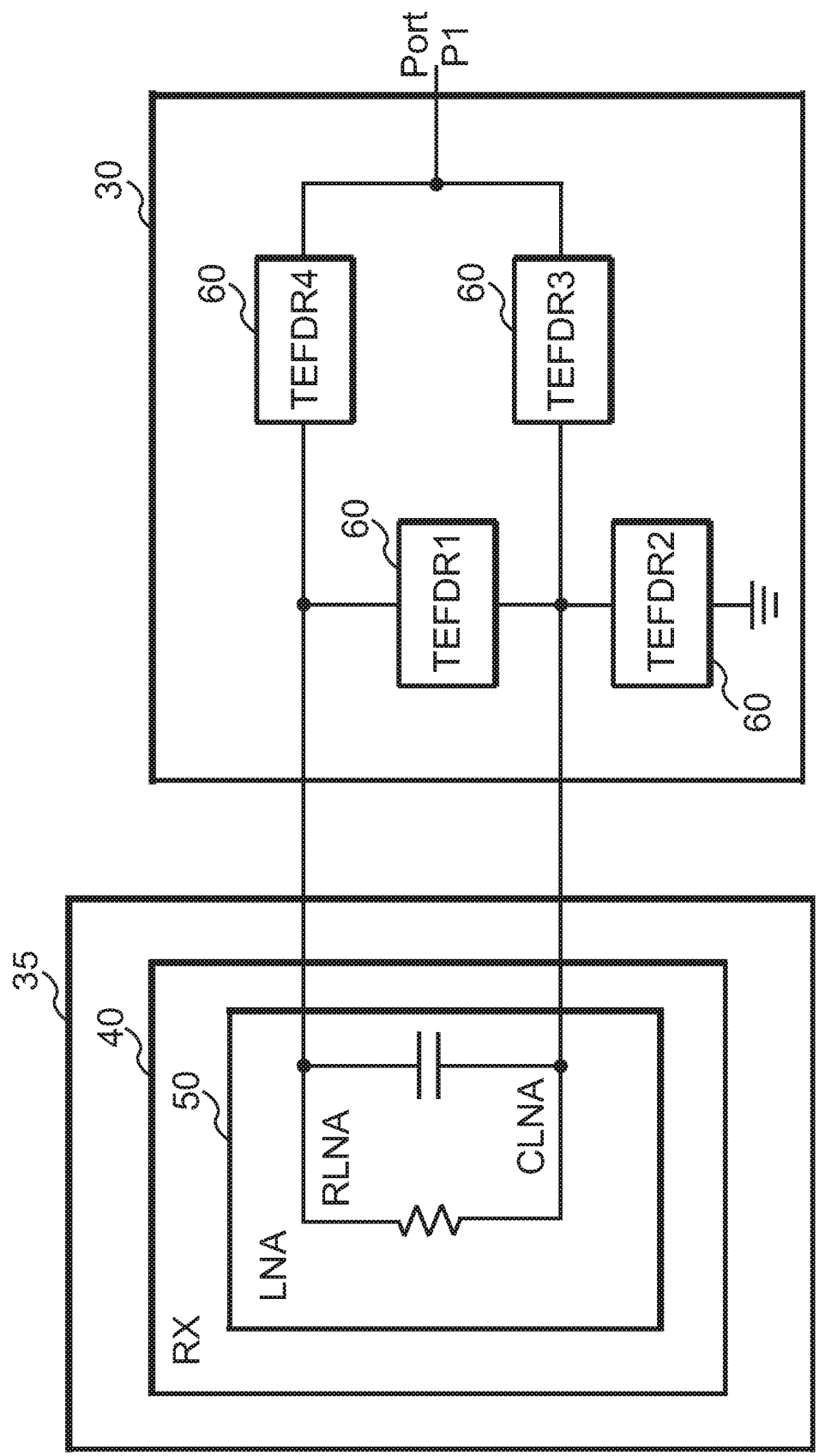
FIG. 11 shows a circuit arrangement for a 12-element multi-band matching balun according to an exemplary embodiment.

FIG. 11 shows a circuit arrangement for a 12-element multi-band matching balun 30 according to an exemplary embodiment. In this embodiment, all four LREs (i.e., LRE1-LRE4) in FIG. 10 are replaced with four corresponding TEFDRs (i.e., TEFDR1-TEFDR4).

Referring to FIG. 11, multi-band matching balun 30 is coupled to port P1 (e.g., single-ended antenna, filter, etc., with a given impedance, such as 50Ω). Multi-band matching balun 30 is also coupled to RF apparatus 35, more specifically, to the input of RX circuitry 40.

In the embodiment shown, the input of RX circuitry 40 includes LNA 50. The input circuit of LNA 50 is represented by a resistor RLNA (e.g., 750Ω) in parallel with a capacitor CLNA (e.g., 1.1 pF). Thus, multi-band matching balun 30 provides impedance matching between the impedance presented at port P1 and the input impedance of LNA 50.

As noted, twelve-element multi-band matching baluns are obtained by replacing all four LREs in FIG. 10 with TEFDRs to realize the circuit in FIG. 11. The TEFDRs may be any of the TEFDRs shown in FIGS. 6-9. Depending on the choice of TEFDRs to replace the LREs in FIG. 10, multi-band matching baluns with different and/or desired characteristics (e.g., frequency bands of operation) may be obtained.

Figure 12:
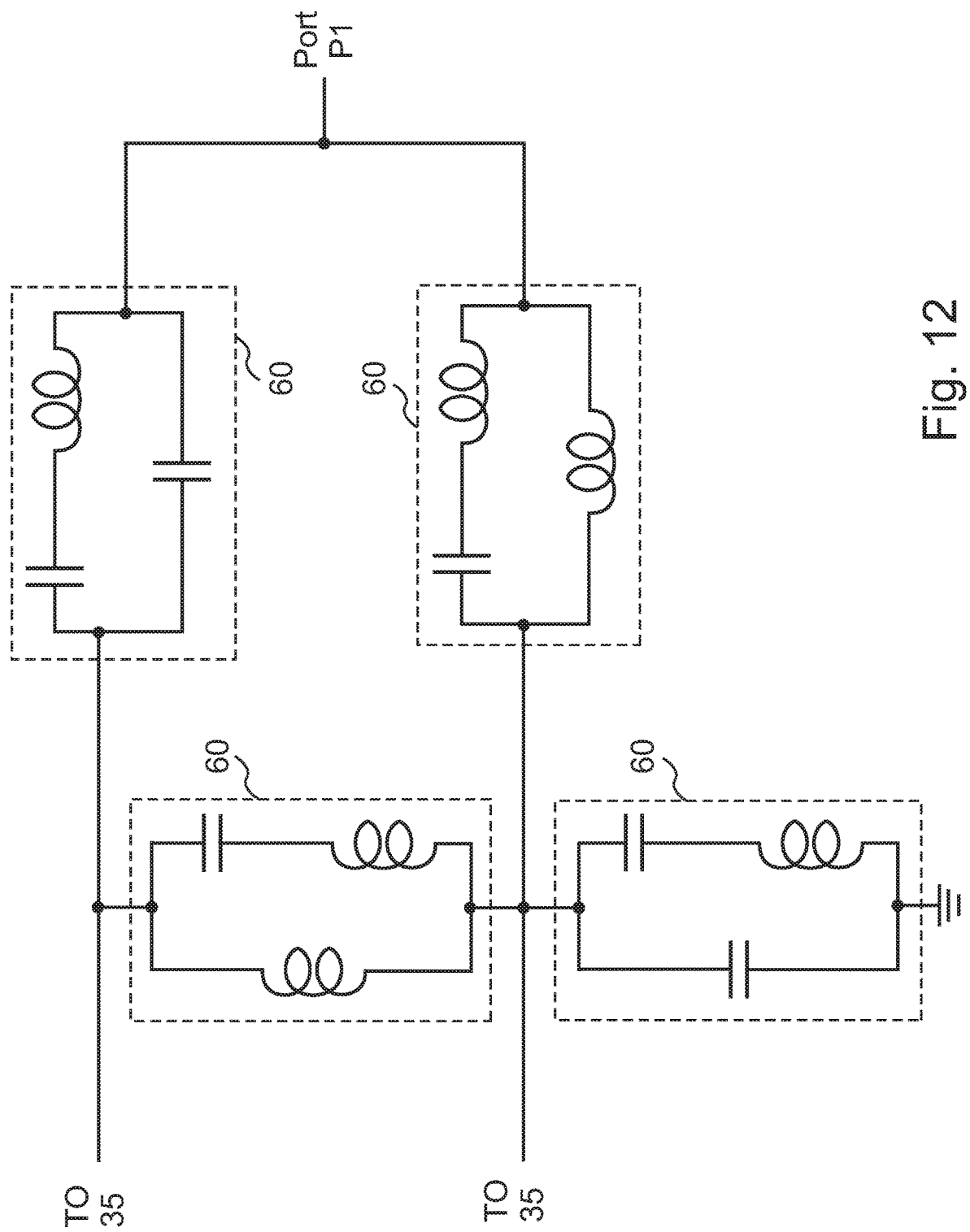
FIG. 12 shows a circuit arrangement for a 12-element multi-band matching balun according to an exemplary embodiment.

As merely one example, FIG. 12 shows a circuit arrangement for a 12-element multi-band matching balun 30 according to an exemplary embodiment. The multi-band matching balun shown in the exemplary embodiment of FIG. 12 is obtained by: (i) replacing LRE1 in FIG. 10 (or inductor L1 in FIG. 1) with TEFDR 60 shown in FIG. 6; (ii) replacing LRE2 in FIG. 10 (or capacitor C1 in FIG. 1) with TEFDR 60 shown in FIG. 8; (iii) replacing LRE3 in FIG. 10 (or inductor L2 in FIG. 1) with TEFDR 60 shown in FIG. 6; and (iv) replacing LRE4 in FIG. 10 (or capacitor C2 in FIG. 1) with TEFDR 60 shown in FIG. 8.

Multi-band matching balun 30 in FIG. 12 illustrates merely one example of a 12-element multi-band matching balun, which uses TEFDRs 60 shown in FIGS. 6 and 8, but not TEFDRs 60 shown in FIGS. 7 and 9. Other possibilities exist and are contemplated for realizing 12-element multi-band matching baluns. For example, in some embodiments, rather than using TEFDR 60 shown in FIG. 6 to realize inductor L1 (and/or inductor L2) in FIG. 1, TEFDR 60 shown in FIG. 7 may be used. As another example, in some embodiments, TEFDR 60 shown in FIG. 6 may be used to realize inductor L1 in FIG. 1, and TEFDR 60 shown in FIG. 7 may be used to realize inductor L2.

Similar options exist with respect to realizing (or replacing) capacitors. For example, in some embodiments, rather than using TEFDR 60 shown in FIG. 8 to realize inductor C1 (and/or inductor L2) in FIG. 1, TEFDR 60 shown in FIG. 9 may be used. As another example, in some embodiments, TEFDR 60 shown in FIG. 8 may be used to realize capacitor C1 in FIG. 1, and TEFDR 60 shown in FIG. 8 may be used to realize capacitor C2.

Figure 13:
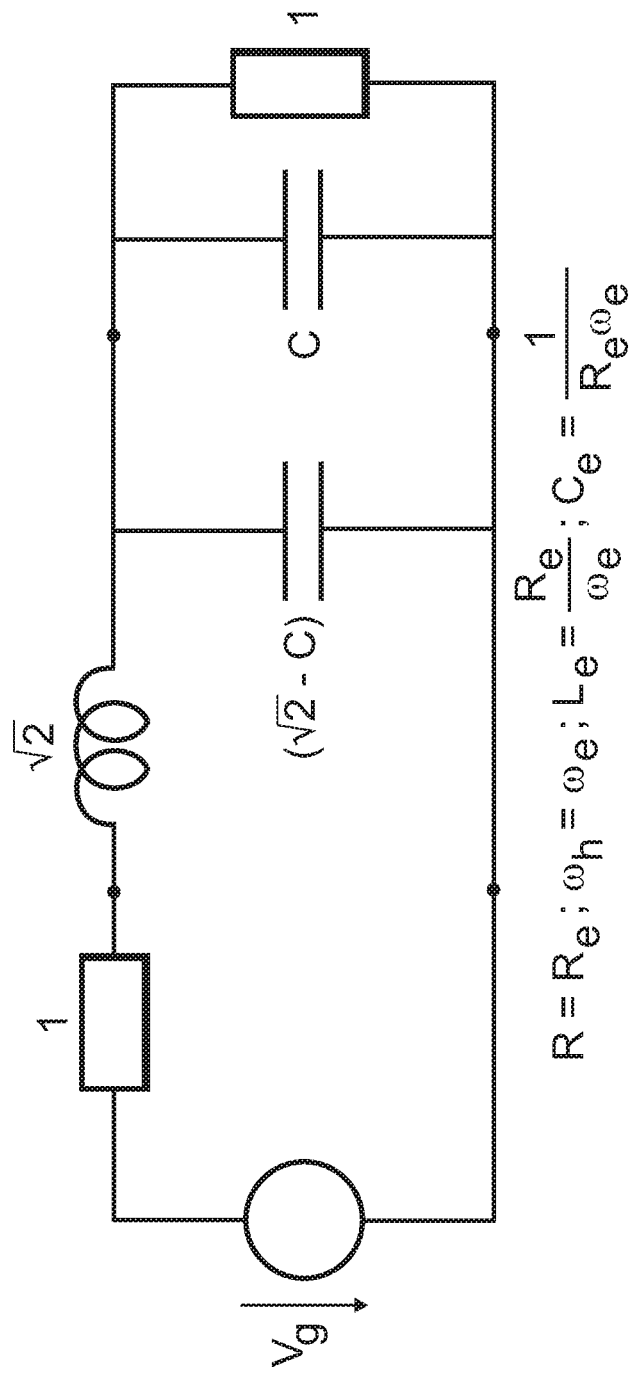
FIG. 13 shows a circuit arrangement for calculating impedance matching circuitry component values.

One aspect of the disclosure relates to differential matching circuits, for example, matching circuits to match a circuit with a 125-ohm impedance to a circuit with a 500-ohm impedance. Design of impedance matching circuits starts with using the matching network given in D. C. Youla, A New Theory of Broadband Matching, IEEE Transactions on Circuits and Systems, CT11: 30-50 (1964). FIG. 13 shows Youla's circuit arrangement for calculating impedance matching circuitry component values.

More specifically, FIG. 13 shows a second-order single-ended matching circuit if the generator and termination impedances have the same real part (but possibly different complex parts). The matching circuit provides maximally flat low-pass S11 responses up to the desired −3 dB cut-off frequency of the band of interest.

The design of the matching circuit includes determination of the relative frequency ($\omega_e$) unit, which is equal to the targeted cut-off frequency, and the determination of the relative resistance ($R_e$) unit, as shown in FIG. 13. Once the relative frequency ($\omega_e$) unit and the relative resistance ($R_e$) unit are known, the relative capacitance and inductance units (denoted by $C_e$ and $L_e$, respectively) are derived, as shown in FIG. 13. Note that the component or element values in FIG. 13 are in relative units, i.e., relatively to $\omega_e$ and $R_e$.

If the load capacitance (C) value (in $C_e$ relative units) exceeds the square-root of 2 ($\sqrt{2}$), then the parallel capacitance of the matching circuit (the capacitor with the value of $\sqrt{2}$−C) will have a negative capacitance value. In impedance matching circuits according to various embodiments, the parallel capacitance is replaced with a parallel inductance. Although doing so tends to restrict bandwidth somewhat (because the inductor's frequency characteristics are different from a capacitor's), it is nevertheless a relatively good compromise as it provides relatively high bandwidth (WB), with realizable (e.g., non-negative) component values and at relatively low cost.

The matching circuit is calculated for half of the differential HB-WB RX impedance matching circuit (or LB-WB RX impedance matching circuit) to provide matching between single-ended terminations with equal impedance real parts, e.g., between a 250-ohm generator and a 250-ohm in parallel with 2 pF of capacitance load.

Figure 14:
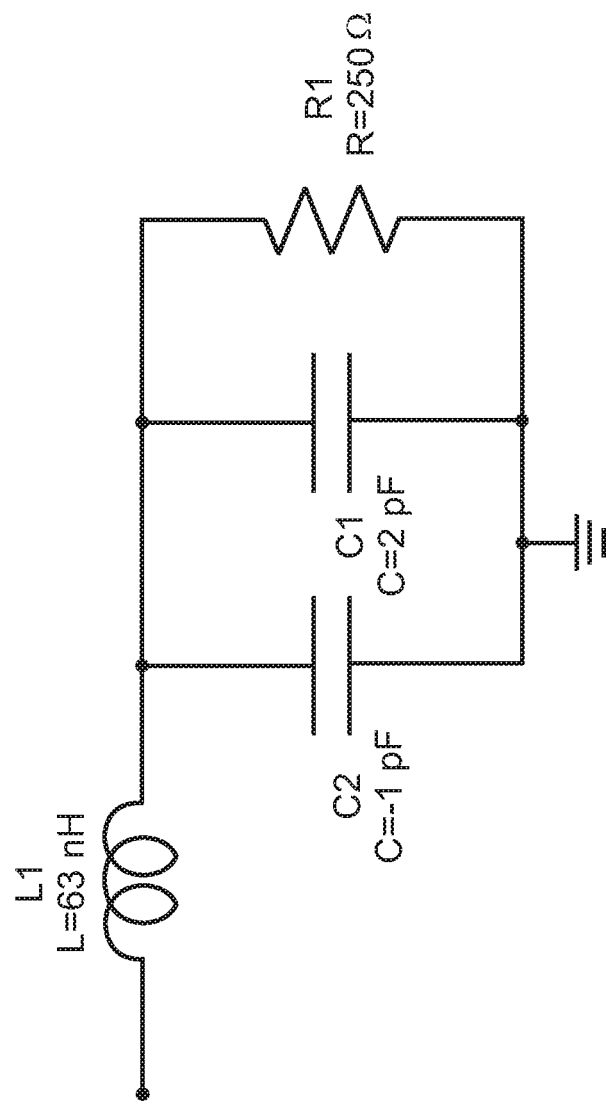
FIG. 14 shows a circuit arrangement for an impedance matching circuitry.

FIG. 14 shows a circuit arrangement for such an impedance matching circuitry. The targeted −3 dB cutoff for S11 is 899 MHz in this example. Note that the parallel matching capacitor (C2) has a negative capacitance, i.e., −1 pF.

Figure 15:
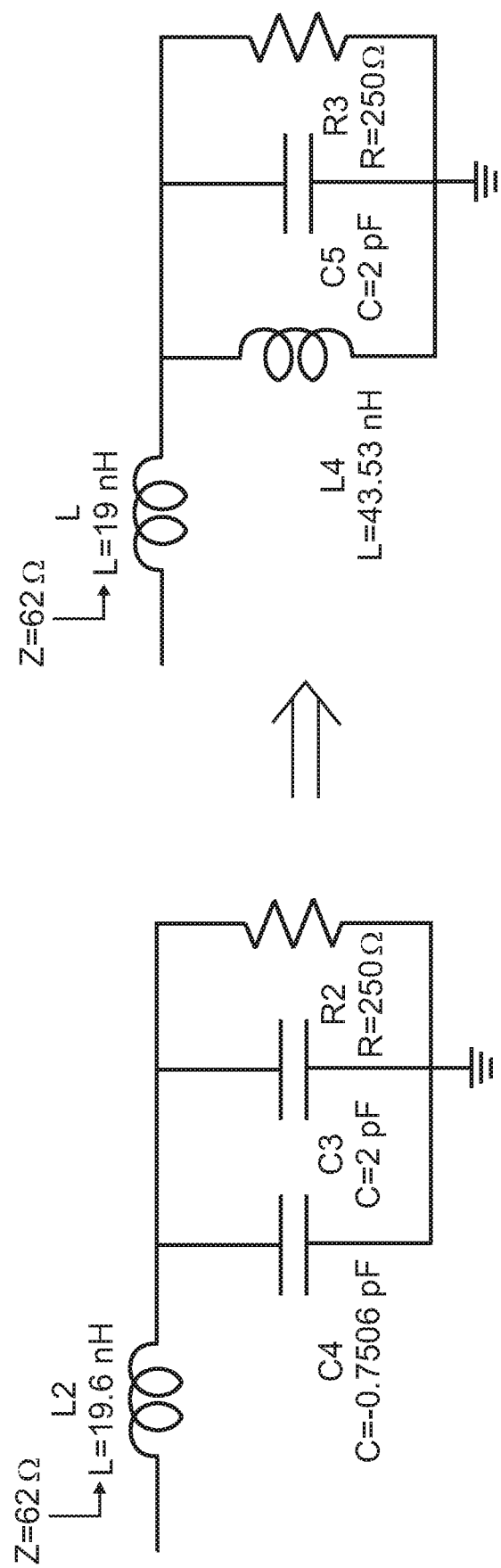
FIG. 15 shows a circuit arrangement for transforming an impedance matching circuitry according to an exemplary embodiment.

Next, the impedance matching circuit is optimized to provide impedance matching between non-equal termination impedances, such as between 62 ohms and 250 ohms in this example. Optimization may be performed in a variety of ways, as desired. Examples include circuit optimization techniques like gradient, simulated annealing, genetic optimization techniques, and the like, as persons of ordinary skill in the art will understand. FIG. 15 shows the resulting impedance matching circuits. In the circuit on the left side of FIG. 15, the parallel capacitor (C4) has a negative capacitance. In the circuit on the right side of FIG. 15, capacitor C4 has been replaced with inductor L4, as described above, with an inductance of 43.53 nH.

As a result, the circuit may be realized using physical, real-life components, such as surface mount device (SMD) components. The impedance matching circuit on the right side of FIG. 15 has ~240 MHz bandwidth (992 MHz to 752 MHz), corresponding to the HB-WB impedance matching operation.

Figure 16:
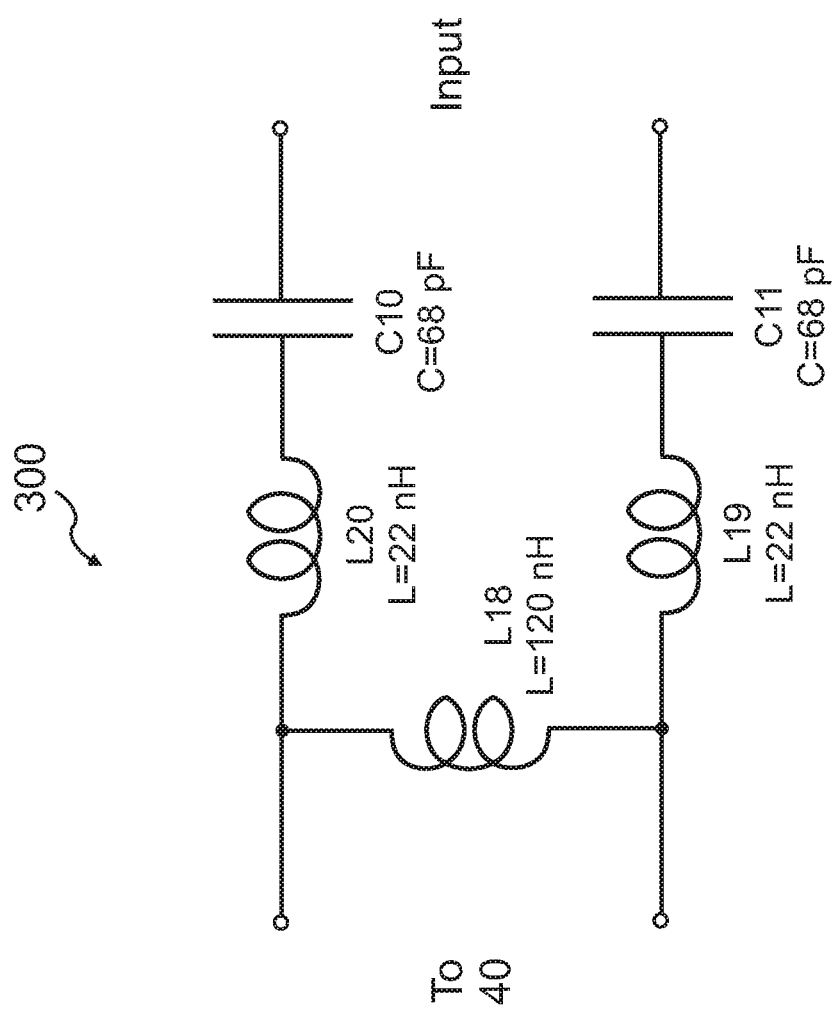
FIG. 16 shows a circuit arrangement for wideband impedance matching circuitry working in high, relatively high, or higher (than lower frequency bands) frequency bands (denoted by "HB-WB") according to an exemplary embodiment.

FIG. 16 shows a circuit arrangement for an HB-WB RX impedance matching circuit 300 according to an exemplary embodiment. More specifically, FIG. 16 shows a differential HB-WB RX impedance matching circuit 300 that provides impedance matching between a 125-ohm generator and a parallel resistor-capacitor (RC), e.g., 500 ohms and 1 pF.

HB-WB RX impedance matching circuit 300 is created from two single-ended circuits, as described above. FIG. 16 shows the final schematic of HB-WB RX impedance matching circuit 300, i.e., after designing a half circuit and optimizing, as described above), for HB-WB operation in the 780 MHz to 950 MHz frequency band.

Note that capacitors C10 and C11 capacitors are DC bypass capacitors. They prevent DC currents from flowing into the input of the RX low noise amplifier (LNA). If the RX circuitry includes internal DC blocking, capacitors C10 and C11 may be omitted from HB-WB RX impedance matching circuit 300.

The same procedure as described above with respect to HB-WB RX impedance matching circuits may be used to design and realize impedance matching circuits for other frequencies, for example, LB-WB RX impedance matching circuits. At lower frequencies, the capacitance unit ($C_e$) is higher and, thus, the parallel capacitor in the impedance matching circuit might have a positive value.

Figure 17:
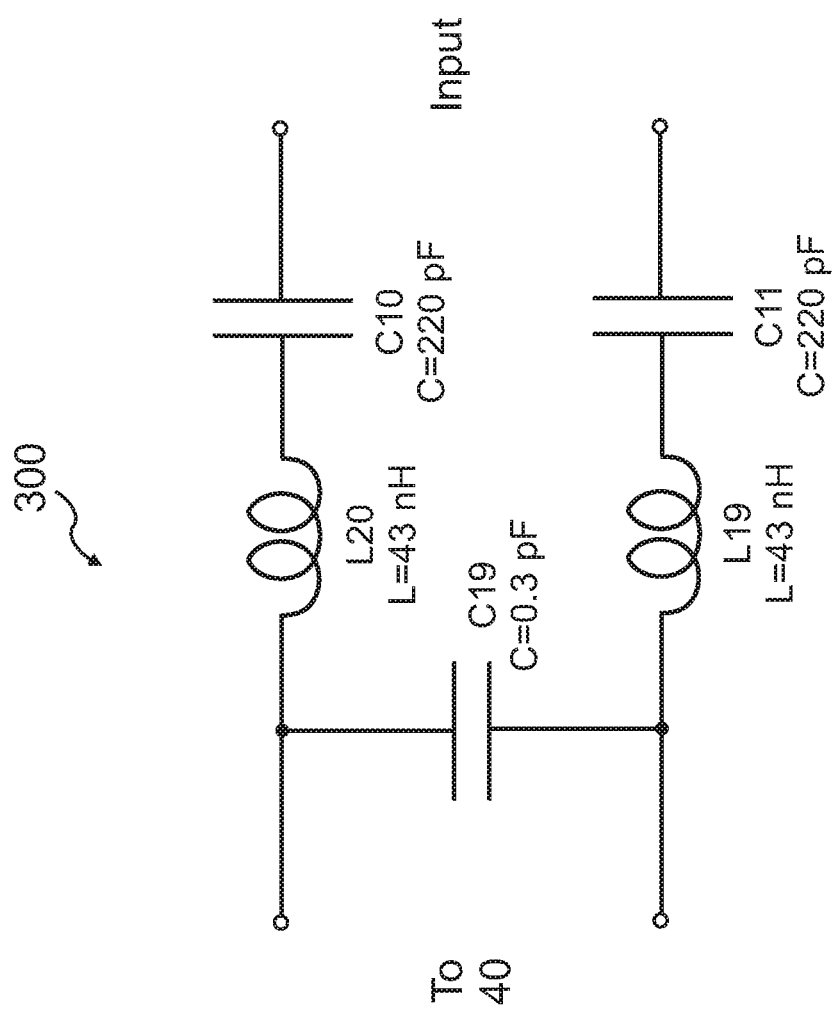
FIG. 17 shows a circuit arrangement for wideband impedance matching circuitry working in low, relatively low.

FIG. 17 shows a final circuit arrangement for an LB-WB impedance matching circuit 300 according to an exemplary embodiment. In the example shown, LB-WB RX impedance matching circuit 300 provides differential impedance matching between the same terminations as assumed above for HB-WB impedance matching, i.e., between a 125-ohm generator and a 500-ohm and 1 pF parallel RC load. LB-WB RX impedance matching circuit 300 provides impedance matching in the LB frequency band, 310 MHz to 510 MHz for the example shown.

Note that capacitors C10 and C11 capacitors are DC bypass capacitors. They prevent DC currents from flowing into the input of the RX LNA. If the RX circuitry includes internal DC blocking, capacitors C10 and C11 may be omitted from LB-WB RX impedance matching circuit 300.

One aspect of the disclosure relates to wideband matching baluns that operate in multiple bands (wideband multi-band matching baluns. For example, some embodiments provide dual wideband matching baluns, i.e., multi-resonant circuits that simultaneously realize both the balun and impedance matching functions in dual-wideband frequency ranges. The frequency ranges may in some embodiments constitute 310-510, ±10% for the lower band (LB), and 780-950 MHz, ±10% for the higher band (HB). The LB thus has a bandwidth of about 200 MHz (510-310), and the HB has a bandwidth of about 170 MHz. The 200 MHz (for LB) and 170 MHz (for HB) bandwidth denote that the matching baluns not only operate in dual frequency bands (LB and HB), but they also provide relatively high bandwidth (200 MHz and 170 MHz, for LB and HB, respectively) in both frequency bands (LB and HB).

Wideband multi-band matching baluns according to various embodiments provide a relatively low-cost solution that use relatively few elements (e.g., lumped surface-mount device (SMD)), such as 21 elements in some embodiments, 20 elements in some embodiments, down to 9 elements in some embodiments, as described below in detail, all without using tunable or variable components or elements. During the design process of a matching circuit a determination is made of the optimum termination impedance (e.g., for the LNA in an RX circuit). The realized matching network or circuit should provide or present that impedance to the LNA at the differential input of the RX circuit. The optimum termination impedance would be the complex conjugate of the input impedance of the LNA.

In practice, however, the relatively high-Q LNA impedance on RX circuits makes realization of a complex conjugate impedance either impractical, difficult, or sometimes even impossible with existing technology at reasonable cost, size, area, etc. As a compromise that still provides reasonable performance, a match may be made for maximum voltage gain, i.e. for the highest impedance while the input capacitance of the LNA (CLNA) is resonated out by the matching circuit. As an example, in some embodiments, CLNA is ~1.1 pF (a value that may take parasitic elements into account). For such an example, the input resistance of the LNA (RLNA) may be chosen at 500 ohms (or even 750 ohms). The matching circuit/balun then matches the impedance at the input of the LNA with the impedance at the antenna, typically a single-ended 50-ohm impedance.

There are number of single wide-band ceramic balun components available on market, but they typically match an impedance of between 50 and 100-200 ohms. Those values are typically fail to provide acceptable RX (or TX) performance with typical high impedance receiver RF chips. On the other hand, sometimes the realized matching circuit/ balun network should be inductive as well to be able to resonate out CLNA in the desired frequency bands.

In various embodiments, the wideband multi-band matching balun includes a multi-resonant circuit arrangement that simultaneously realizes both the balun and impedance matching functions in multiple wideband frequency ranges. Thus, in various embodiments, the wideband multi-band matching balun includes a multi-band balun coupled to a differential-to-differential matching circuit. In other words, the multi-band balun interfaces a single-ended antenna to the differential-to-differential matching circuit. The differential-to-differential matching circuit interfaces the multi-band balun to an RF receiver with a differential input, e.g., an RF receiver including an LNA with a differential input.

Figure 18:
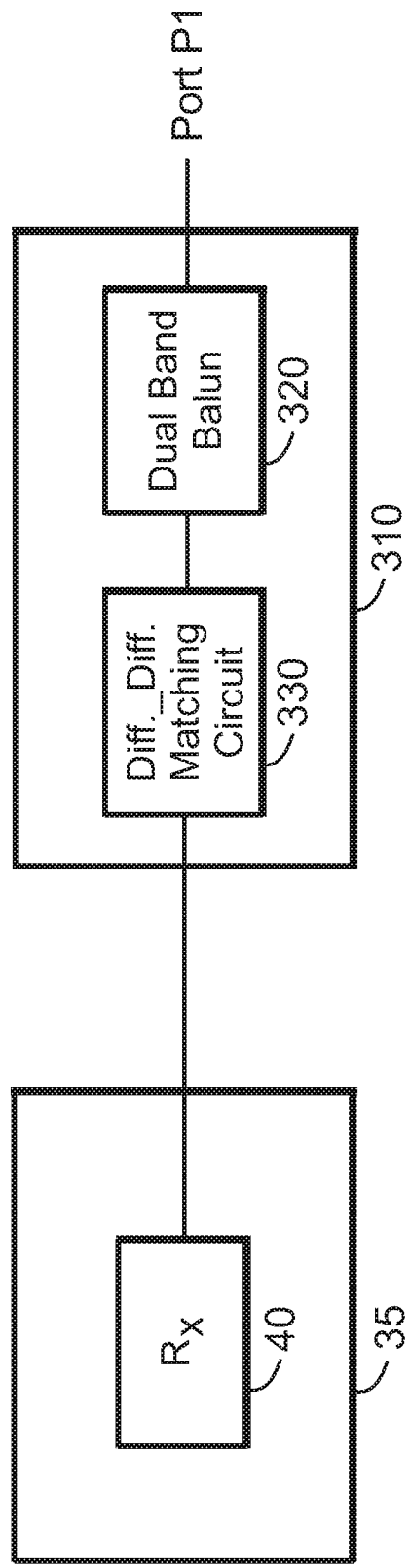
FIG. 18 shows a circuit arrangement for an RF apparatus with a wideband multi-band matching balun according to an exemplary embodiment.

FIG. 18 shows a circuit arrangement for an RF apparatus 35 with a wideband multi-band matching balun 310 according to an exemplary embodiment. In the embodiment in FIG. 18, the wideband multi-band matching balun 310 includes a multi-band (dual-band in the example shown) balun 320 coupled to a differential-to-differential matching circuit 330. The multi-band balun 320 has one port coupled to a port labeled "Port P1," which typically has a single-ended antenna (not shown) attached to it. The other port of the multi-band balun 320 couples to the differential-to-differential matching circuit 330. Thus, the multi-band balun 32 provides an interface between the unbalanced (single-ended) antenna and the balanced (differential) matching circuit 330. Another port of the differential-to-differential matching circuit 330 couples to the RF apparatus 35. In the example shown, the differential-to-differential matching circuit 330 couples to the RX circuit 40 (e.g., to an LNA). As persons of ordinary skill in the art will understand, however, the differential-to-differential matching circuit 330 may instead or in addition couple to TX circuit, for example, as shown in FIGS. 4-5.

Figure 19:
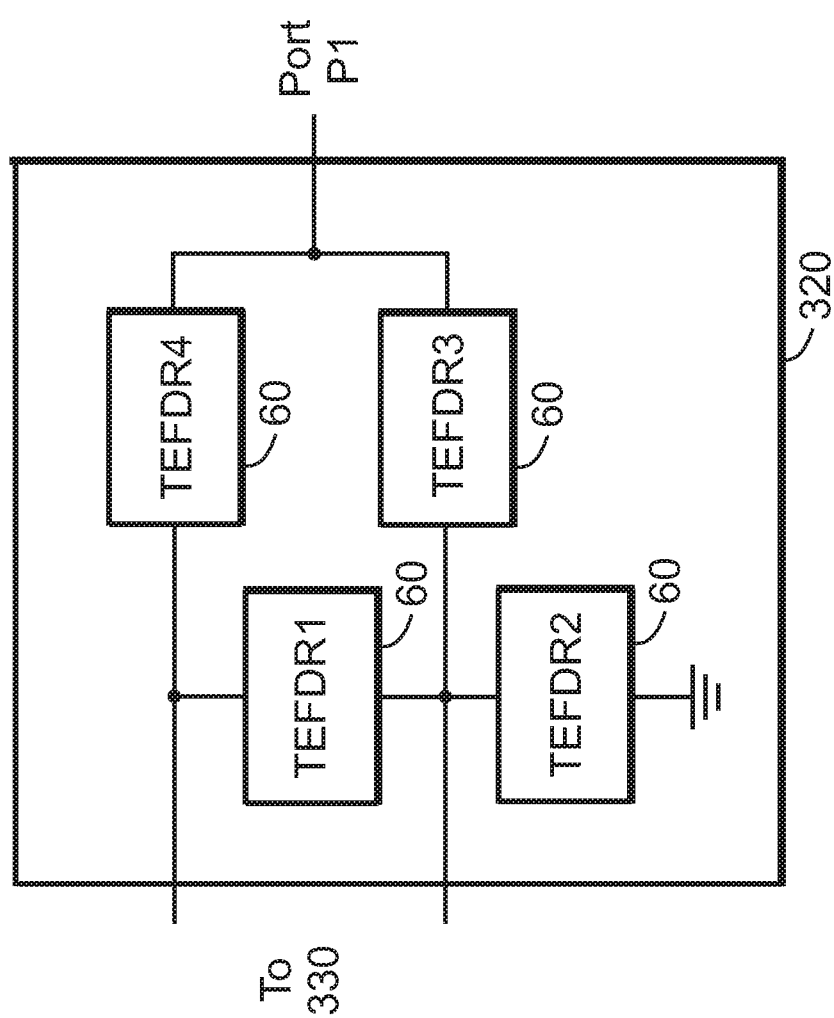
FIG. 19 shows a circuit arrangement for a dual-band balun according to an exemplary embodiment.

Referring again to FIG. 18, in various embodiments, the multi-band balun 320 may use one or more TEFDRs, which are described above and illustrated in FIGS. 6-9. FIG. 19 shows a circuit arrangement for a multi-band balun 320 according to an exemplary embodiment that uses four three-element frequency-dependent resonators (TEFDRs) 60, labeled TEFDR1-TEFDR4, respectively. The TEFDRs can function as frequency-dependent components, and may be used to make circuits resonating in multiple frequency bands. As a result, wideband multi-band matching balun may be realized that offer matching functionality and balun functionality in multiple relatively wide frequency bands. For instance, two separate single-band wideband matching circuits may be designed by calculating component values for both low- and high-frequency bands (using the procedure and equations described above), and the various components may be each replaced with a corresponding TEFDR to arrive at a wideband multi-band circuit.

Figure 20:
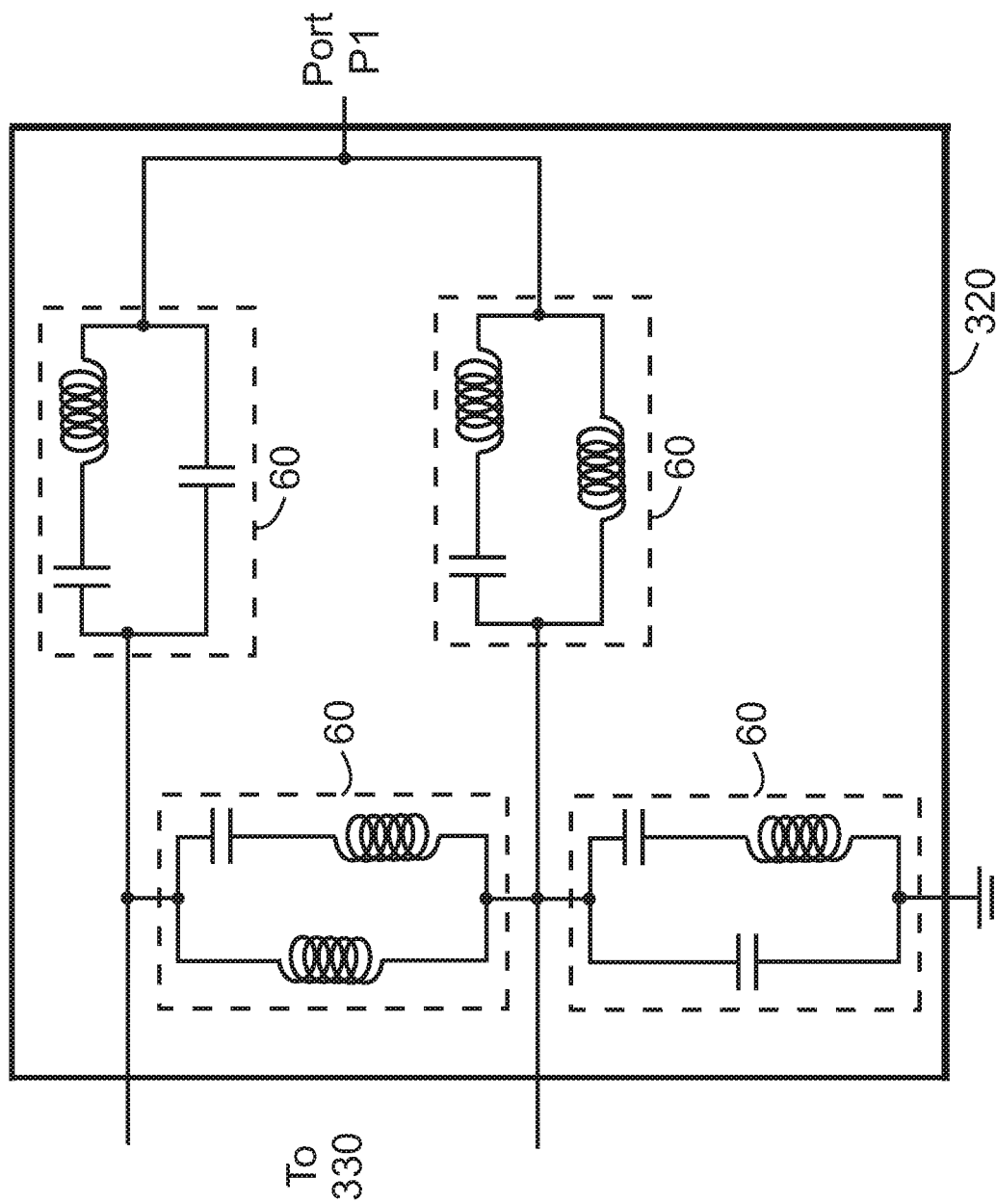
FIG. 20 shows a circuit arrangement for a dual-band balun according to an exemplary embodiment.

Referring again to FIG. 19, the multi-band balun 320 shown has the same topology of the 12-element multi-band matching balun 30 in FIG. 11. In the embodiment of FIG. 19, however, rather than coupling to an RX circuit, the multi-band balun 320 couples to the differential-to-differential matching circuit 330 (not shown; see FIG. 18). FIG. 20 shows a circuit arrangement for an example implementation of the multi-band balun 320 of FIG. 19. The circuit arrangement for the multi-band balun 320 in FIG. 20 is similar to the circuit arrangement in FIG. 12, as it uses the four TEFDRs 60, implemented as specific types of TEFDRs, but the multi-band balun 320 couples to the differential-to-differential matching circuit 330 (not shown; see FIG. 18).

Figure 21:
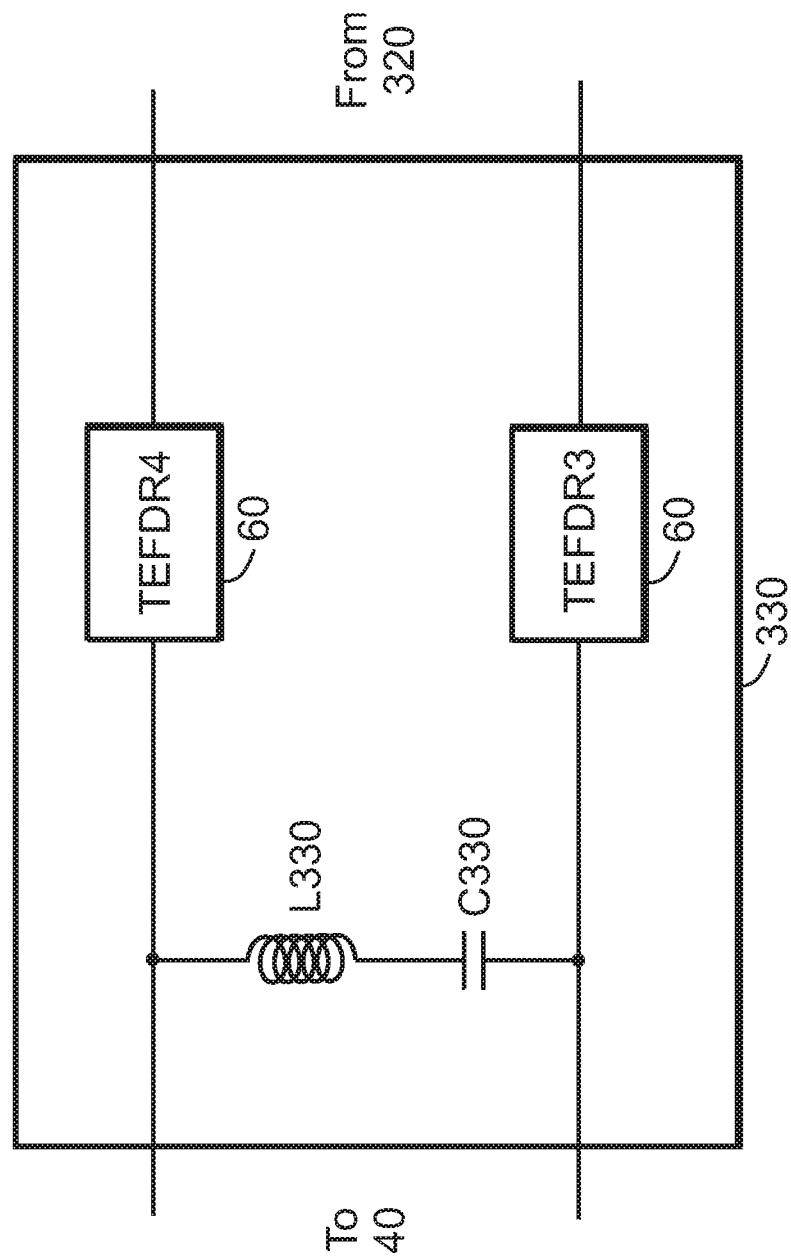
FIG. 21 shows a circuit arrangement for a differential-to-differential matching circuit according to an exemplary embodiment.

FIG. 21 shows a circuit arrangement for a differential-to-differential matching circuit 330 according to an exemplary embodiment, which may be used with the multi-band balun 320, for example, the multi-band balun 320 in FIG. 20. In such an exemplary embodiment, the overall wideband multi-band matching balun 310 would include 20 elements or components (6 TEFDRs, adding to 18 elements, plus L330 and C330, for a total of 20 elements). Referring again to FIG. 21, the differential-to-differential matching circuit 330 in this exemplary embodiment uses two TEFDRs 60, plus an inductor L330 and a capacitor C330, coupled in a series arrangement (series LC).

The series LC load, which includes the inductor L330 and the capacitor C330, forms a load. The inductor L330 provides a load for the higher frequency band, and the capacitor C330 provides a load for the lower frequency band. In some embodiments, however, rather than using a series LC network, a parallel LC network may be used (i.e., the capacitor C330 coupled in parallel with the inductor L330). Such a scenario may arise if, for example, the higher frequency band uses a capacitor as a load whereas the lower frequency band uses an inductor as a load. In such cases, rather than a series LC network, as shown in FIG. 21, a parallel LC network may be used. Furthermore, in some embodiments, rather than using the inductor L330 and the capacitor C330, an additional TEFDR may be used. Such a scenario may arise if, for example, both the low band and the high band use the same type of component, i.e., both bands use an inductor or both bands use a capacitor. In such cases, an additional TEFDR may be used to realize the inductor or capacitor, respectively. Note that such embodiments include 21 elements, rather than the 20 elements described above, as the additional TEFDR in such embodiments would use three elements, rather than a 2-element LC network. Referring again to FIG. 21, the differential-to-differential matching circuit 330 in FIG. 21 is similar to the circuit arrangements in FIGS. 16 and 17, except that the DC blocking capacitors C11 and C12 have been omitted, and the two TEFDRs implement the inductors L19 and L20. Referring to FIG. 21, the inductor L330 implements (or realizes or substitutes for) the inductor L18 in FIG. 16, whereas the capacitor C330 in FIG. 21 implements (or realizes or substitutes for) the capacitor C19 in FIG. 17.

Figure 22:
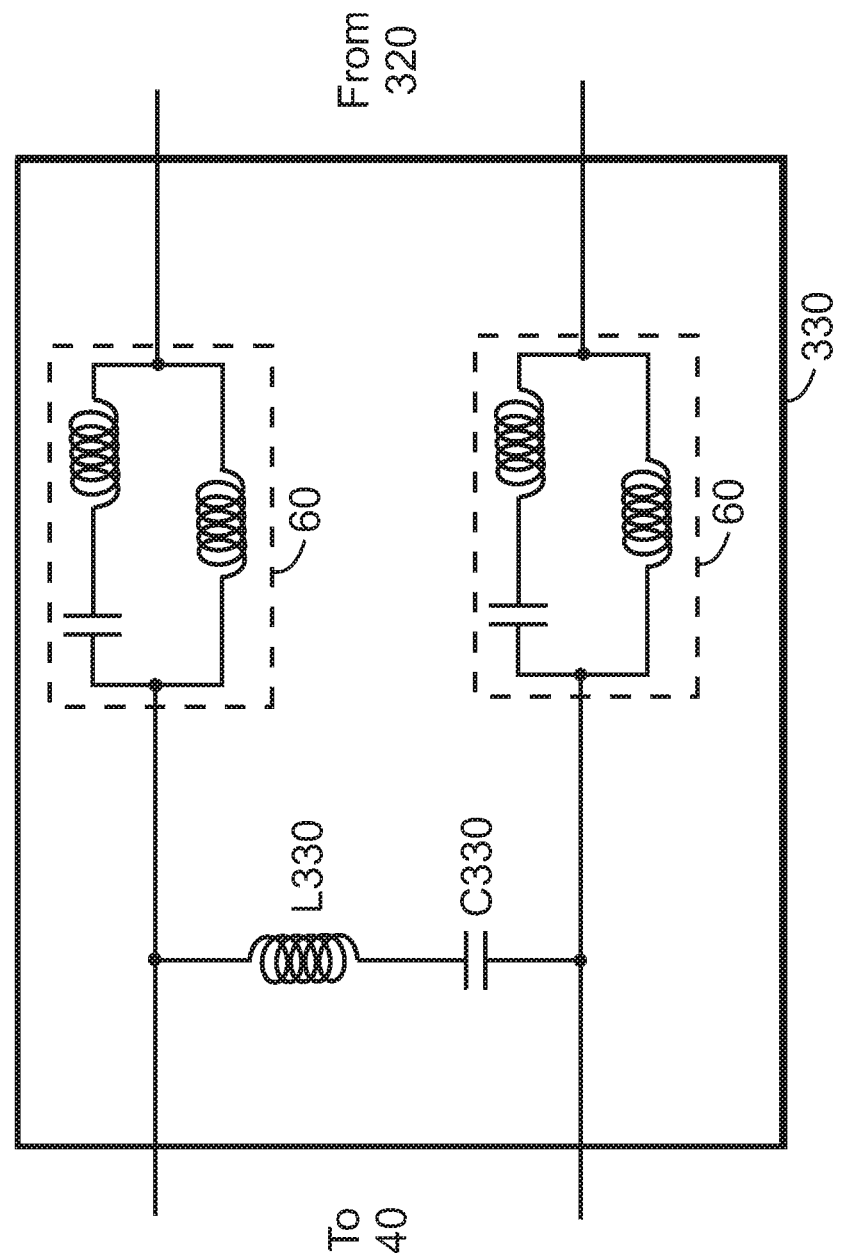
FIG. 22 shows a circuit arrangement for a differential-to-differential matching circuit according to an exemplary embodiment.

FIG. 22 shows a circuit arrangement for an example implementation of the differential-to-differential matching circuit 330 of FIG. 21. The circuit arrangement for the differential-to-differential matching circuit 330 in FIG. 22 is similar to the circuit arrangement in FIG. 21, but it uses specific types of TEFDRs 60 (a series LC network coupled in parallel with a capacitor, for the example shown).

Note that the inductor L330 and the capacitor C330 are typically used for sub-GHz frequency ranges and impedance conditions mentioned above (50 ohms to ~500 ohms). As noted above, for other frequency bands or ranges, both the low- and high-band circuits might use the same type of component (capacitor or inductor). In such a situation, an additional TEFDR may be used to implement that component (capacitor or inductor), and the series LC circuit (L330 and C330) may be omitted (e.g., as shown in differential-to-differential matching circuit 330 in FIG. 26). Note that such an implementation would result in the use of 21 elements overall. As further noted above, in some embodiments, the inductor L330 and the capacitor C330, but in a parallel LC network configuration.

Note further that, using the example above for the impedance values, the differential-to-differential matching circuit 330 provides an impedance match between 500 ohm (LNA) and 125 ohms (the multi-band balun 320). The multi-band balun 320, on the other hand, interfaces at an impedance of 125 ohms with the differential-to-differential matching circuit 330, and at an impedance of 50 ohms with an antenna. Other impedance values may be used, however, by making appropriate modifications to the exemplary embodiments described above, as persons of ordinary skill in the art will understand.

Another aspect of the disclosure relates to trading off performance of the wideband multi-band matching balun 310 with its element count. In other words, the bill of materials (which includes the components) can be reduced while keeping an acceptable level of performance of the wideband multi-band matching balun 310. Thus one or more of the following techniques or any combination of those techniques may be used to implement wideband multi-band matching baluns 310 according to exemplary embodiments: (1) instead of using the 12-element multi-band balun 320, 10-, 8-, or 6-element multi-band baluns may be used (see FIGS. 23-24); (2) a coil balun may be used (see FIG. 26); (3) the balun of FIG. 1 may be substituted for the multi-band balun 320; and/or (4) the series LC circuit that includes the inductor L330 and the capacitor C330 may be omitted (see FIG. 26).

Figure 23:
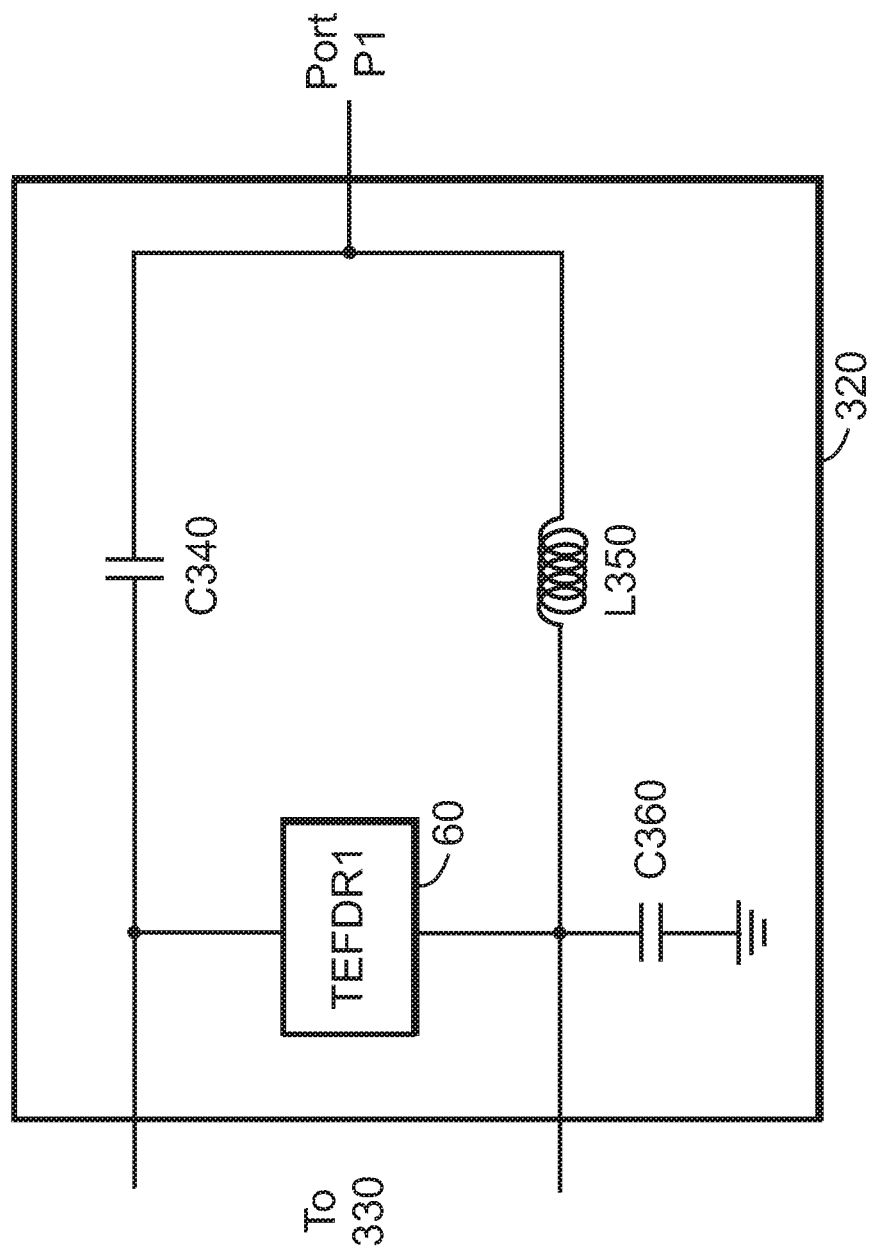
FIG. 23 shows a circuit arrangement for a dual-band balun according to an exemplary embodiment.
Figure 24:
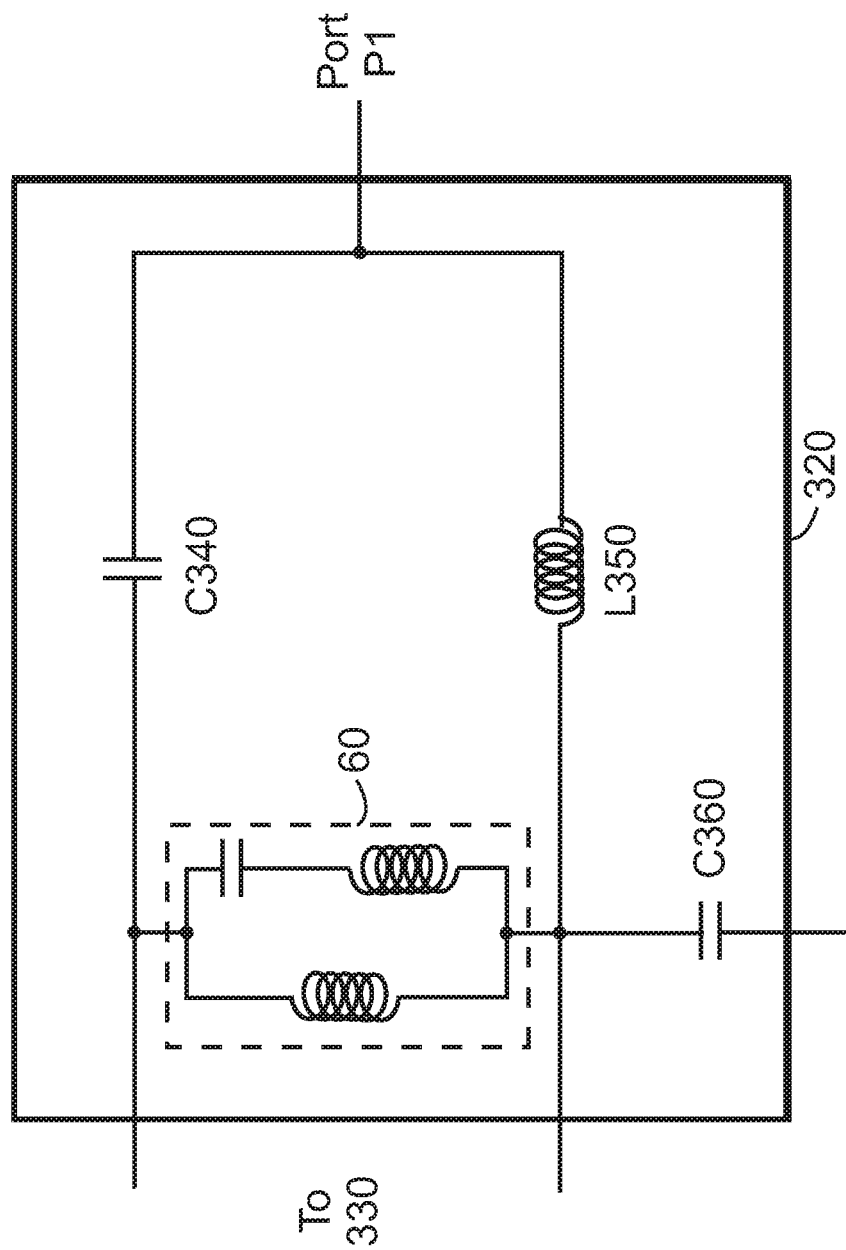
FIG. 24 shows a circuit arrangement for a dual-band balun according to an exemplary embodiment.

As an example of the first technique listed above, FIG. 23 shows a circuit arrangement for a multi-band balun 320 according to an exemplary embodiment. In this embodiment, the 12-element balun has been replaced by a 6-element balun, which includes the capacitors C340 and C360, the inductor L350, and the TEFDR 60. Using this variation of the multi-band balun 320 with the example differential-to-differential matching circuit 330 shown in FIG. 22 would result in 14-element wideband multi-band matching balun. FIG. 24 shows an example of the multi-band balun 320 in FIG. 23, with the TEFDR 60 implemented as a series LC network in parallel with an inductor.

Figure 25:
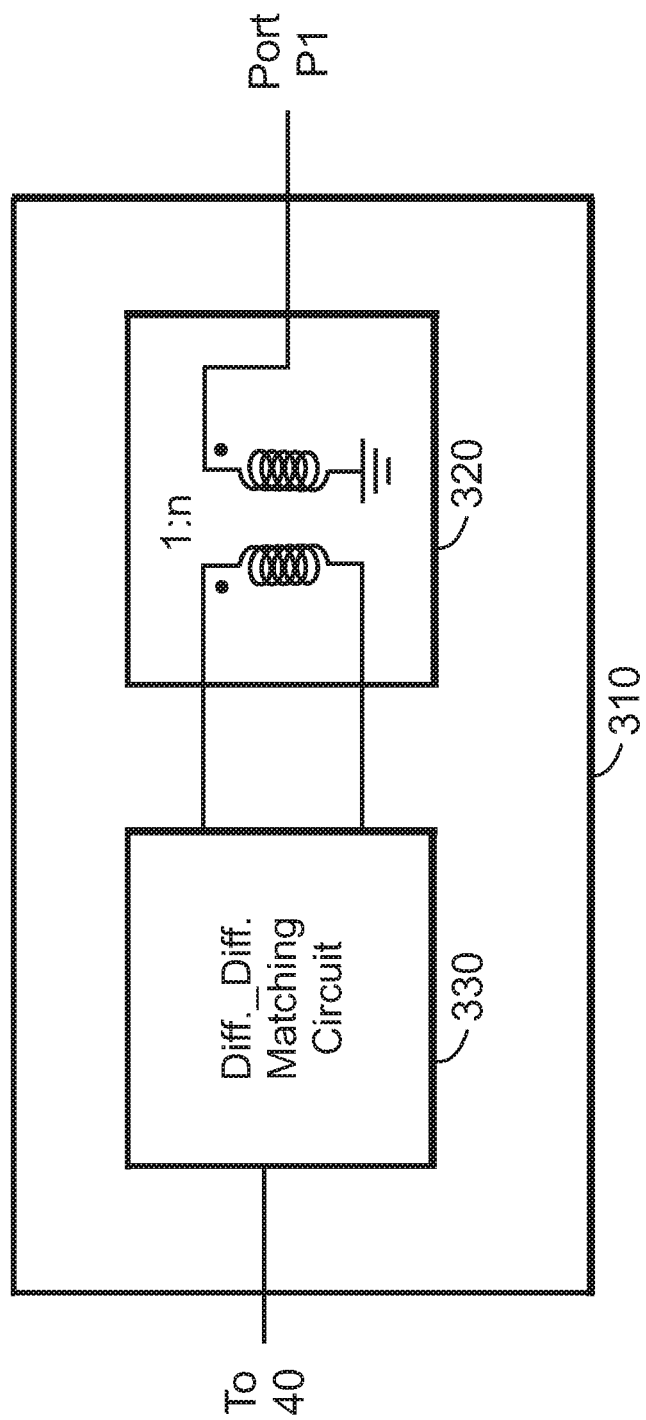
FIG. 25 shows a circuit arrangement for a wideband multi-band matching balun according to an exemplary embodiment.

As an example of the second technique listed above (i.e., using a coil balun), FIG. 25 shows a circuit arrangement for a wideband multi-band matching balun 310 according to an exemplary embodiment. In this embodiment, the multi-band balun 320 has been replaced by a coil balun, e.g., a transformer with an n:1 turns ratio, where n represents a positive integer. Using the coil balun together with the differential-to-differential matching circuit 330, as merely one example implementation, would result in a wideband multi-band matching balun 310 with 8-elements.

Figure 26:
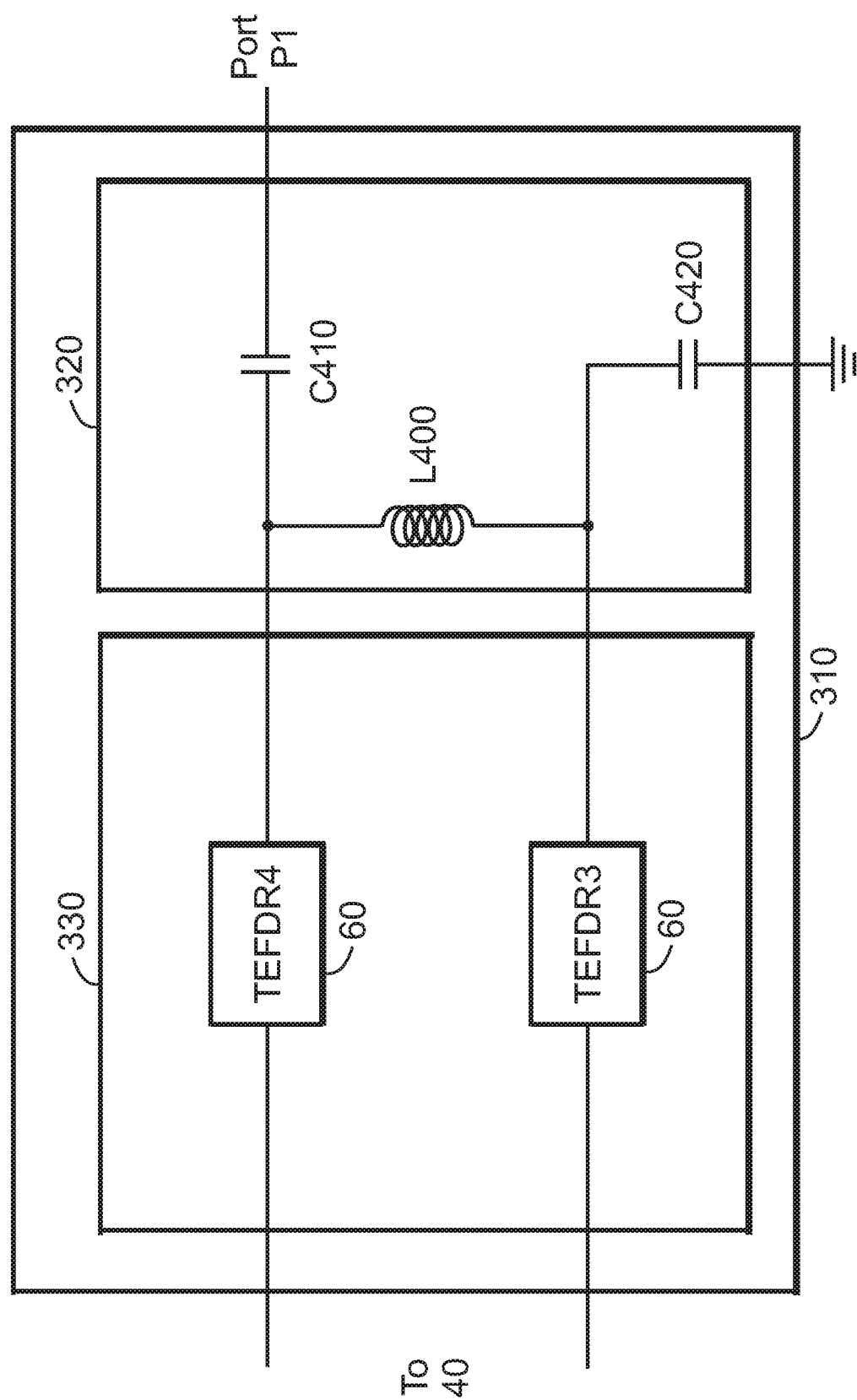
FIG. 26 shows a circuit arrangement for a wideband multi-band matching balun according to an exemplary embodiment.
Figure 27:
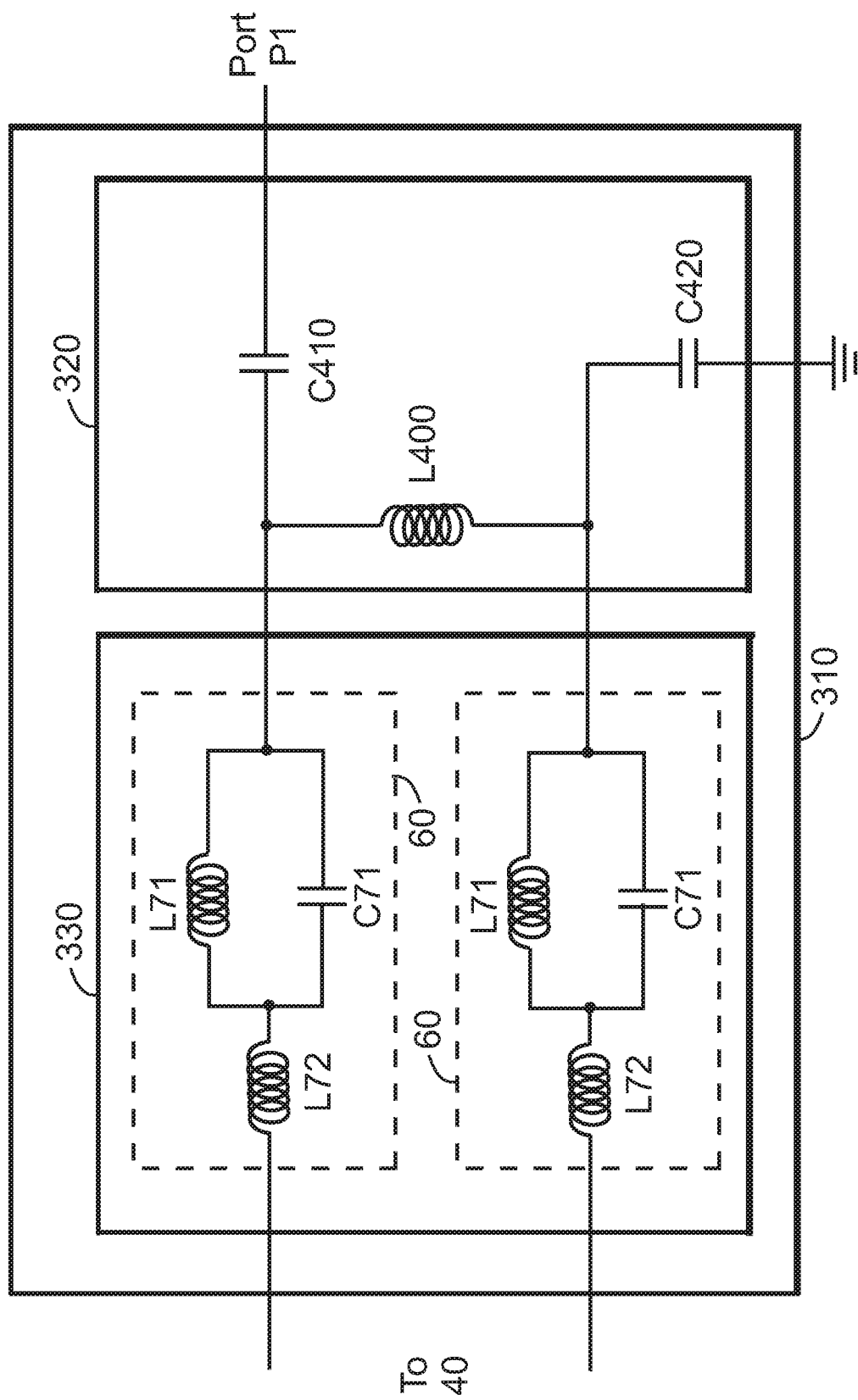
FIG. 27 shows a circuit arrangement for a wideband multi-band matching balun according to an exemplary embodiment.

FIG. 26 shows a circuit arrangement for a wideband multi-band matching balun 310 according to an exemplary embodiment. In this embodiment, the multi-band balun 320 is implemented with three elements, the inductor L400, the capacitor 410, and the capacitor C420. The differential-to-differential matching circuit 330 is similar to the differentialto-differential matching circuit 330 shown in FIG. 21, except that the inductor L330 and the capacitor C330 have been omitted. Note that TEFDRs 60 in FIG. 26 may be implemented using the choices of TEFDR 60 described above, with FIG. 22 showing an example of the differential-to-differential matching circuit 330. Such a choice of implementation of TEFDRs 60 would result in the overall 9-element wideband multi-band matching balun 310 shown in FIG. 27. Note that the 9-element embodiment is the most bill of materials (BOM)-optimized wideband multi-band matching balun 310. A 10-element wideband multi-band matching balun 310 may also be realized by replacing the multi-band balun section 320 in FIG. 27 with the 4-element balun shown in FIG. 1, as described above. Such an embodiment may be used when the differential termination impedance is lower (for example, say, ~100 ohms) than 500 ohms, e.g., for TX networks, since it yields back some phase-error improvements.

The wideband multi-band matching baluns 310, including the multi-band baluns 320 and the differential-to-differential matching circuits 330, may be implement in a variety of ways. For example, in some embodiments, the various elements (or components, such as inductor, capacitor) may be implemented using discrete components, such as SMD components, mentioned above, or through-hold components, depending on factors such as frequencies of interest, performance, cost, space, etc., as persons of ordinary skill in the art will understand. As another example, in some embodiments, the various components may be implemented using distributed components. Furthermore, various target frequencies, bands of frequencies, impedance values, etc., may be accommodated by making appropriate modifications, as persons of ordinary skill in the art will understand.

The wideband multi-band matching baluns 310, including the multi-band baluns 320 and the differential-to-differential matching circuits 330, have been described with reference to RX circuitry. As persons of ordinary skill in the art will understand, however, such circuits may also be used with TX circuitry, and/or TX and RX circuitry (transceiver circuitry), as desired. In this regard, circuits similar to those shown in FIGS. 4-5 may be used, by substituting wideband multi-band matching baluns 310 for matching baluns 30 in those figures.

In some of the various embodiments shown and described above, one or more TEFDRs are used. As noted above, an inductor and a capacitor may each be realized by two distinct types of TEFDR, as shown in FIGS. 6-9. Thus, when substituting a TEFDR for an inductor or for a capacitor, either type of TEFDR may be used, or a mix of the various types may be used, as desired. Furthermore, when using TEFDRs in the multi-band balun 320 and/or the differential-to-differential matching circuit 330, the various types of TEFDRs may be used, as desired.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation. Other modifications and alternative embodiments in addition to the embodiments in the disclosure will be apparent to persons of ordinary skill in the art. Accordingly, the disclosure teaches those skilled in the art the manner of carrying out the disclosed concepts according to exemplary embodiments, and is to be construed as illustrative only. Where applicable, the figures might or might not be drawn to scale, as persons of ordinary skill in the art will understand.

The particular forms and embodiments shown and described constitute merely exemplary embodiments. Persons skilled in the art may make various changes in the shape, size and arrangement of parts without departing from the scope of the disclosure. For example, persons skilled in the art may substitute equivalent elements for the elements illustrated and described. Moreover, persons skilled in the art may use certain features of the disclosed concepts independently of the use of other features, without departing from the scope of the disclosure.

The invention claimed is:

1. An apparatus, comprising:
a radio-frequency (RF) apparatus; and
a wideband multi-band matching balun using passive components to provide simultaneous balun and impedance matching functionality in multiple bands, the wideband multi-band matching balun comprising:
 a multi-band balun, the multi-band balun comprising at least one three-element frequency-dependent resonator (TEFDR); and
 a differential-to-differential matching circuit coupled to the RF apparatus that provides impedance matching between the RF apparatus and the multi-band balun, the differential-to-differential matching circuit comprising at least one TEFDR,
 wherein the at least one TEFDR in the multi-band balun, the differential-to-differential matching circuit, or both, provides functionality of an inductor having a frequency-dependent inductance or a capacitor having a capacitance having a frequency-dependent capacitance.

2. The apparatus according to claim 1, wherein the multi-band balun comprises four TEFDRs, and wherein the differential-to-differential matching circuit comprises two TEFDRs.

3. The apparatus according to claim 2, wherein the differential-to-differential matching circuit further comprises an inductor and a capacitor coupled to the two TEFDRs, wherein the inductor and the capacitor are coupled in series.

4. The apparatus according to claim 1, wherein the RF apparatus comprises receive circuitry or transmit circuitry.

5. The apparatus according to claim 1, wherein the RF apparatus comprises both receive circuitry and transmit circuitry.

6. The apparatus according to claim 1, wherein the at least one TEFDR in the multi-band balun comprises (a) two inductors coupled to one capacitor; or (b) one inductor coupled to two capacitors.

7. The apparatus according to claim 1, wherein the at least one TEFDR in the differential-to-differential matching circuit comprises (a) two inductors coupled to one capacitor; or (b) one inductor coupled to two capacitors.

8. The apparatus according to claim 1, wherein the at least one three-element frequency-dependent resonator in the multi-band balun or in the differential-to-differential matching circuit realizes an inductor having an inductance that varies as a function of frequency.

9. The apparatus according to claim 1, wherein the at least one three-element frequency-dependent resonator in the multi-band balun or in the differential-to-differential matching circuit realizes a capacitor having a capacitance that varies as a function of frequency.

10. An apparatus, comprising:
a radio-frequency (RF) apparatus; and
a wideband multi-band matching balun using passive components to provide simultaneous balun and impedance matching functionality in multiple bands, the wideband multi-band matching balun comprising:
a multi-band balun, the multi-band balun comprising four three-element frequency-dependent resonator (TEFDRs); and
a differential-to-differential matching circuit coupled to the RF apparatus, the differential-to-differential matching circuit comprising:
a series inductor-capacitor (LC) network; and
a pair of TEFDRs, comprising all fixed-value components, coupled to a series LC network,
wherein at least one TEFDR in the multi-band balun, the differential-to-differential matching circuit, or both, provides functionality of an inductor having a frequency-dependent inductance or a capacitor having a capacitance having a frequency-dependent capacitance.

11. The apparatus according to claim 10, wherein any of the TEFDRs realizes an inductor having an inductance that varies as a function of frequency or a capacitor having a capacitance that varies as a function of frequency.

12. The apparatus according to claim 10, wherein any of the TEFDRs comprises either (a) two capacitor and an inductor, or (b) two inductors and a capacitor.

13. The apparatus according to claim 10, wherein the multi-band balun operates in a lower band of frequency and in a higher band of frequency comprising frequencies higher than frequencies of the lower band of frequency, wherein the lower band of frequency comprises 310-510 MHz, ±10%.

14. The apparatus according to claim 13, wherein the higher band of frequency comprises 780-950 MHz, ±10%.

15. A method of operating an apparatus that includes a radio-frequency (RF) apparatus, the method comprising using a wideband multi-band matching balun using passive components to provide simultaneous balun and impedance matching functionality in multiple bands, wherein the wideband multi-band matching balun includes a multi-band balun coupled to a differential-to-differential matching circuit, wherein the multi-band balun comprises at least one three-element frequency-dependent resonator (TEFDR), and wherein the differential-to-differential matching circuit comprises at least one TEFDR, wherein the at least one TEFDR in the multi-band balun, the differential-to-differential matching circuit, or both, provides functionality of an inductor having a frequency-dependent inductance or a capacitor having a capacitance having a frequency-dependent capacitance.

16. The method according to claim 15, wherein the multi-band balun comprises four TEFDRs, and wherein the differential-to-differential matching circuit comprises two TEFDRs.

17. The method according to claim 15, wherein the differential-to-differential matching circuit further comprises an inductor and a capacitor coupled to the two TEFDRs, wherein the inductor and the capacitor are coupled in series.

18. The method according to claim 15, wherein any of the TEFDRs comprises (a) two inductors coupled to one capacitor; or (b) one inductor coupled to two capacitors.

19. The method according to claim 15, wherein the at least one three-element frequency-dependent resonator in the multi-band balun or in the differential-to-differential matching circuit realizes an inductor having an inductance that varies as a function of frequency.

20. The method according to claim 15, wherein the at least one three-element frequency-dependent resonator in the multi-band balun or in the differential-to-differential matching circuit realizes a capacitor having a capacitance that varies as a function of frequency.

* * * * *